(12) United States Patent
Lee

(10) Patent No.: US 8,956,697 B2
(45) Date of Patent: Feb. 17, 2015

(54) METHOD OF MANUFACTURING ORGANIC LIGHT-EMITTING DISPLAY APPARATUS AND ORGANIC LIGHT-EMITTING DISPLAY APPARATUS MANUFACTURED BY USING THE METHOD

(71) Applicant: Samsung Display Co., Ltd., Yongin, Gyeonggi-Do (KR)

(72) Inventor: Dong-Kyu Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 33 days.

(21) Appl. No.: 13/794,540

(22) Filed: Mar. 11, 2013

(65) Prior Publication Data

US 2014/0014920 A1    Jan. 16, 2014

(30) Foreign Application Priority Data

Jul. 10, 2012    (KR) ........................ 10-2012-0075143

(51) Int. Cl.

| | |
|---|---|
| *C23C 16/00* | (2006.01) |
| *H01L 27/32* | (2006.01) |
| *H01L 51/00* | (2006.01) |
| *C23C 14/04* | (2006.01) |
| *C23C 14/12* | (2006.01) |
| *C23C 14/24* | (2006.01) |
| *C23C 14/56* | (2006.01) |
| *H01L 51/56* | (2006.01) |

(52) U.S. Cl.
CPC .......... *H01L 27/326* (2013.01); *H01L 51/0011* (2013.01); *C23C 14/042* (2013.01); *C23C 14/12* (2013.01); *C23C 14/246* (2013.01); *C23C 14/568* (2013.01); *H01L 51/56* (2013.01); *H01L 51/0052* (2013.01); *H01L 51/006* (2013.01); *H01L 51/0072* (2013.01)
USPC ........................................ 427/248.1; 118/715

(58) Field of Classification Search
None
See application file for complete search history.

(56) References Cited

U.S. PATENT DOCUMENTS

| | | |
|---|---|---|
| 6,274,198 B1 | 8/2001 | Dautartas |
| 6,371,451 B1 | 4/2002 | Choi |
| 6,443,597 B1 | 9/2002 | Natori |
| 6,541,130 B2 | 4/2003 | Fukuda |
| 6,749,906 B2 | 6/2004 | Van Slyke |

(Continued)

FOREIGN PATENT DOCUMENTS

| | | | |
|---|---|---|---|
| EP | 1413644 A2 | | 4/2004 |
| EP | 1418250 | * | 12/2004 |

(Continued)

OTHER PUBLICATIONS

KIPO Registration Determination Certificate dated Nov. 30, 2011, for Korean Patent application 10-2009-0056530, (5 pages).

(Continued)

*Primary Examiner* — Joseph Miller, Jr.
(74) *Attorney, Agent, or Firm* — Chrstie, Parker & Hale, LLP

(57) ABSTRACT

A method of manufacturing an organic light-emitting display apparatus and an organic light-emitting display apparatus manufactured by using the method. A method of manufacturing an organic light-emitting display apparatus includes continuously depositing an organic layer of a linear pattern on a substrate; depositing a second electrode on the organic layer; and forming a passivation layer on the second electrode to cover the second electrode.

23 Claims, 14 Drawing Sheets

(56) References Cited

U.S. PATENT DOCUMENTS

| | | | |
|---|---|---|---|
| 6,995,035 B2 | 2/2006 | Cok et al. | |
| 7,202,007 B2 * | 4/2007 | Shibata et al. | 430/199 |
| 7,495,389 B2 | 2/2009 | Noguchi et al. | |
| 7,601,439 B2 | 10/2009 | Chun et al. | |
| 7,776,457 B2 | 8/2010 | Lee et al. | |
| 7,872,256 B2 | 1/2011 | Sung et al. | |
| 2001/0006827 A1 | 7/2001 | Yamazaki et al. | |
| 2002/0017245 A1 | 2/2002 | Tsubaki et al. | |
| 2002/0076847 A1 | 6/2002 | Yamada et al. | |
| 2002/0168577 A1 | 11/2002 | Yoon | |
| 2003/0101937 A1 | 6/2003 | Van Slyke et al. | |
| 2003/0168013 A1 | 9/2003 | Freeman et al. | |
| 2003/0221614 A1 | 12/2003 | Kang et al. | |
| 2003/0232563 A1 | 12/2003 | Kamiyama et al. | |
| 2004/0115338 A1 * | 6/2004 | Yoneda | 427/66 |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0194702 A1 | 10/2004 | Sasaki et al. | |
| 2005/0016461 A1 * | 1/2005 | Klug et al. | 118/726 |
| 2005/0031836 A1 | 2/2005 | Hirai | |
| 2005/0037136 A1 | 2/2005 | Yamamoto | |
| 2005/0166842 A1 | 8/2005 | Sakamoto | |
| 2005/0186330 A1 | 8/2005 | Kim et al. | |
| 2006/0066231 A1 | 3/2006 | Nishikawa et al. | |
| 2006/0144325 A1 | 7/2006 | Jung et al. | |
| 2006/0174829 A1 | 8/2006 | An et al. | |
| 2006/0197458 A1 * | 9/2006 | Winters et al. | 315/169.1 |
| 2006/0205101 A1 | 9/2006 | Lee et al. | |
| 2006/0244696 A1 | 11/2006 | Jung et al. | |
| 2007/0009652 A1 * | 1/2007 | Manz et al. | 427/58 |
| 2007/0075955 A1 | 4/2007 | Jung et al. | |
| 2007/0077358 A1 | 4/2007 | Jeong et al. | |
| 2007/0164662 A1 * | 7/2007 | Eida et al. | 313/504 |
| 2007/0178708 A1 | 8/2007 | Ukigaya | |
| 2008/0018236 A1 | 1/2008 | Arai et al. | |
| 2008/0042138 A1 * | 2/2008 | Park et al. | 257/72 |
| 2008/0115729 A1 | 5/2008 | Oda et al. | |
| 2008/0131587 A1 | 6/2008 | Boroson et al. | |
| 2008/0216741 A1 | 9/2008 | Ling et al. | |
| 2009/0001882 A1 | 1/2009 | Park et al. | |
| 2009/0017192 A1 | 1/2009 | Matsuura | |
| 2009/0232976 A1 | 9/2009 | Yoon et al. | |
| 2009/0233385 A1 * | 9/2009 | Okumura et al. | 438/16 |
| 2009/0269881 A1 | 10/2009 | Furuta et al. | |
| 2009/0302750 A1 | 12/2009 | Jun et al. | |
| 2009/0308317 A1 * | 12/2009 | Sone et al. | 118/719 |
| 2010/0090594 A1 | 4/2010 | Choi et al. | |
| 2010/0328197 A1 | 12/2010 | Lee et al. | |
| 2011/0052791 A1 | 3/2011 | Jo et al. | |
| 2011/0068331 A1 | 3/2011 | Koh et al. | |
| 2011/0266944 A1 | 11/2011 | Song et al. | |
| 2012/0097992 A1 | 4/2012 | Jeong | |
| 2012/0175605 A1 | 7/2012 | Shin et al. | |
| 2012/0299023 A1 | 11/2012 | Lee et al. | |
| 2013/0001528 A1 | 1/2013 | Chang et al. | |

FOREIGN PATENT DOCUMENTS

| | | |
|---|---|---|
| EP | 1518940 A1 | 3/2005 |
| JP | 4-272170 | 9/1992 |
| JP | 11-144865 | 5/1999 |
| JP | 2000-68054 A2 | 3/2000 |
| JP | 2000-323277 | 11/2000 |
| JP | 2001-52862 A2 | 2/2001 |
| JP | 2001-093667 | 4/2001 |
| JP | 2002-175878 | 6/2002 |
| JP | 2003-3250 A2 | 1/2003 |
| JP | 2003-77662 A2 | 3/2003 |
| JP | 2003-157973 | 5/2003 |
| JP | 2003-297562 | 10/2003 |
| JP | 2004-043898 A2 | 2/2004 |
| JP | 2004-103269 | 4/2004 |
| JP | 2004-103341 | 4/2004 |
| JP | 2004-199919 | 7/2004 |
| JP | 2005-44592 A2 | 2/2005 |
| JP | 2005-235568 | 9/2005 |
| JP | 2005-293968 | 10/2005 |
| JP | 2005-296737 | 10/2005 |
| JP | 2006-275433 A2 | 10/2006 |
| JP | 2007-47293 | 2/2007 |
| JP | 2007-242436 | 9/2007 |
| JP | 2008-121098 | 5/2008 |
| JP | 2009-019243 | 1/2009 |
| JP | 2009-087910 | 4/2009 |
| KR | 10-0257219 B1 | 2/2000 |
| KR | 10-2000-0019254 A | 4/2000 |
| KR | 10-2000-0023929 A | 5/2000 |
| KR | 2001-0030175 A | 4/2001 |
| KR | 10-2001-0039298 A | 5/2001 |
| KR | 10-2001-0059939 | 7/2001 |
| KR | 10-2002-0000201 | 1/2002 |
| KR | 10-2002-0050922 | 6/2002 |
| KR | 10-2002-0090934 | 12/2002 |
| KR | 10-2002-0091457 A | 12/2002 |
| KR | 10-0405080 B1 | 11/2003 |
| KR | 2003-0091947 | 12/2003 |
| KR | 2003-0093959 | 12/2003 |
| KR | 10-2004-0050045 A | 6/2004 |
| KR | 10-2004-0069281 A | 8/2004 |
| KR | 10-2004-0084747 | 10/2004 |
| KR | 10-0463212 B1 | 12/2004 |
| KR | 10-0483487 B1 | 4/2005 |
| KR | 10-2005-0082644 | 8/2005 |
| KR | 10-0520159 B1 | 10/2005 |
| KR | 10-2006-0008602 A | 1/2006 |
| KR | 10-2006-0018745 A | 3/2006 |
| KR | 10-2006-0045225 A | 5/2006 |
| KR | 10-2006-0051746 A | 5/2006 |
| KR | 10-2006-0053926 A | 5/2006 |
| KR | 10-2006-0059323 A | 6/2006 |
| KR | 10-2006-0073367 A | 6/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0104675 A | 10/2006 |
| KR | 10-2006-0104677 A | 10/2006 |
| KR | 10-2006-0109627 A | 10/2006 |
| KR | 10-0635903 B1 | 10/2006 |
| KR | 10-2006-0114477 A | 11/2006 |
| KR | 10-2006-0114573 A | 11/2006 |
| KR | 10-0646160 B1 | 11/2006 |
| KR | 10-0687007 B1 | 2/2007 |
| KR | 10-0696547 B1 | 3/2007 |
| KR | 10-0697663 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-2007-0037848 A | 4/2007 |
| KR | 10-0711885 B1 | 4/2007 |
| KR | 10-0723627 B1 | 5/2007 |
| KR | 10-0726132 B1 | 6/2007 |
| KR | 10-2007-0078713 A | 8/2007 |
| KR | 10-2007-0080635 A | 8/2007 |
| KR | 10-2007-0101842 A | 10/2007 |
| KR | 10-2007-0105595 A | 10/2007 |
| KR | 10-0770653 B1 | 10/2007 |
| KR | 10-2008-0001184 A | 1/2008 |
| KR | 10-0797787 B1 | 1/2008 |
| KR | 10-0800125 B1 | 1/2008 |
| KR | 10-0815265 B1 | 3/2008 |
| KR | 10-0823508 B1 | 4/2008 |
| KR | 10-0823511 B1 | 4/2008 |
| KR | 10-0827760 B1 | 5/2008 |
| KR | 10-0839380 B1 | 6/2008 |
| KR | 10-2008-0060400 A | 7/2008 |
| KR | 10-2008-0061132 A | 7/2008 |
| KR | 10-2008-0062212 A | 7/2008 |
| KR | 10-2008-0088737 A | 10/2008 |
| KR | 10-2009-0017910 A | 2/2009 |
| KR | 10-2009-0038733 A | 4/2009 |

(56) References Cited

FOREIGN PATENT DOCUMENTS

| KR | 10-2009-0097453 A | 9/2009 |
|---|---|---|
| KR | 10-0961110 B1 | 6/2010 |
| KR | 10-2010-0138139 A | 12/2010 |
| KR | 10-2011-0021090 A | 3/2011 |
| KR | 10-2011-0022512 A | 3/2011 |
| KR | 10-2011-0032589 A | 3/2011 |
| KR | 10-2011-0120213 A | 11/2011 |
| KR | 10-2011-0138787 A | 12/2011 |
| KR | 10-2012-0042155 A | 5/2012 |
| KR | 10-2012-0080855 A | 7/2012 |
| KR | 10-2012-0131545 | 12/2012 |
| KR | 10-2013-0007308 A | 1/2013 |

OTHER PUBLICATIONS

U.S. Office action dated May 24, 2013, for U.S. Appl. No. 13/279,077 (20 pages).

U.S. Office action dated Oct. 7, 2013, issued to U.S. Appl. No. 13/279,077, (29 pages).

\* cited by examiner

METHOD OF MANUFACTURING ORGANIC LIGHT-EMITTING DISPLAY APPARATUS AND ORGANIC LIGHT-EMITTING DISPLAY APPARATUS MANUFACTURED BY USING THE METHOD

CROSS-REFERENCE TO RELATED APPLICATION

This application claims the benefit of Korean Patent Application No. 10-2012-0075143, filed on Jul. 10, 2012 in the Korean Intellectual Property Office, the entire content of which is incorporated herein by reference.

BACKGROUND

1. Field

Aspects of embodiments of the present invention relate to a method of manufacturing an organic light-emitting display apparatus and an organic light-emitting display apparatus manufactured by using the method.

2. Description of the Related Art

Organic light-emitting display apparatuses have wider viewing angles, better contrast characteristics, and faster response speeds than other display devices, and thus have drawn attention as a next-generation display device.

An organic light-emitting display apparatus includes intermediate layers including an emission layer disposed between a first electrode and a second electrode that are arranged opposite to each other. The electrodes and the intermediate layers may be formed using various methods, one of which is an independent deposition method. When an organic light-emitting display apparatus is manufactured by using the deposition method, a fine metal mask (FMM) having the same pattern as that of an organic layer to be formed is disposed to closely contact a substrate on which the organic layer and the like are formed, and an organic layer material is deposited on the FMM to form the organic layer having the desired pattern.

However, the deposition method using such an FMM presents difficulties in manufacturing larger organic light-emitting display apparatuses using a large mother glass. For example, when such a large mask is used, the mask may bend due to self-gravity, thereby distorting a pattern. Such disadvantages are not conducive for the recent trend toward high-definition patterns.

Moreover, processes of aligning a substrate and an FMM to closely contact each other, performing deposition thereon, and separating the FMM from the substrate are time-consuming, resulting in a long manufacturing time and low production efficiency.

Information disclosed in this Background section may have already been known to the inventors of the present invention before achieving the present invention or may include technical information acquired in the process of achieving the present invention. Therefore, it may contain information that does not form the prior art that is already known in this country to one of ordinary skill in the art.

SUMMARY

According to aspects of embodiments of the present invention, a method of manufacturing an organic light-emitting display apparatus is suitable for use in the mass production of a large substrate and enables high-definition patterning, and an organic light-emitting display apparatus may be manufactured by using the method.

According to an embodiment of the present invention, a method of manufacturing an organic light-emitting display apparatus includes: continuously depositing an organic layer of a linear pattern on a substrate; depositing a second electrode on the organic layer; and forming a passivation layer on the second electrode to cover the second electrode.

The depositing of the second electrode on the organic layer may include depositing the second electrode on the organic layer for each of a plurality of panels, and the forming of the passivation layer on the second electrode may include forming the passivation layer on the second electrode to cover the second electrode.

The depositing of the second electrode on the organic layer may include continuously depositing the second electrode of a linear pattern on the organic layer, and the forming of the passivation layer on the second electrode may include continuously forming the passivation layer of a linear pattern on the second electrode to cover the second electrode.

The passivation layer may include one or more materials selected from the group consisting of tris(8-hydroxyquinolinato)aluminum ($Alq_3$), a phenylcarbazole-based compound, and a fluorene-based compound.

After the forming of the passivation layer, the method may further include removing the organic layer between adjacent panels of the plurality of panels.

The removing of the organic layer between the adjacent panels may include removing the organic layer by using chemical etching using plasma containing oxygen ($O_2$).

The continuous depositing of the organic layer of the linear pattern on the substrate may include: providing a thin film deposition apparatus including a deposition source containing a deposition material, a deposition source nozzle unit that is arranged at a side of the deposition source and includes a plurality of deposition source nozzles, and a patterning slit sheet that is arranged to face the deposition source nozzle unit and has a plurality of patterning slits formed therein, such that the thin film deposition apparatus is spaced apart from the substrate; moving at least one of the thin film deposition apparatus or the substrate relative to the other during the depositing; spraying the deposition material from the deposition source to be deposited by passing through the patterning slit sheet and forming a pattern on the substrate.

The patterning slit sheet may be smaller than the substrate in at least one of a first direction or a second direction perpendicular to the first direction.

The deposition source nozzles may be arranged in the deposition nozzle unit in a first direction, the patterning slits may be arranged in the patterning slit sheet in the first direction, and the thin film deposition apparatus may further include a shielding plate assembly that is arranged in the first direction between the deposition source nozzle unit and the patterning slit sheet and includes a plurality of shielding plates that divide a space between the deposition source nozzle unit and the patterning slit sheet into a plurality of deposition spaces.

Each of the plurality of shielding plates may extend in a second direction that is substantially perpendicular to the first direction.

The shielding plate assembly may include a first shielding plate assembly that includes a plurality of first shielding plates, and a second shielding plate assembly that includes a plurality of second shielding plates.

Each of the plurality of first shielding plates and each of the plurality of second shielding plates may be formed in a second direction that is substantially perpendicular to the first direction, and may divide a space between the deposition source nozzle unit and the patterning slit sheet into a plurality of deposition spaces.

The deposition source nozzles may be arranged in the deposition source nozzle unit in a first direction, and the patterning slits may be arranged in the patterning slit sheet in a second direction perpendicular to the first direction.

The deposition source, the deposition source nozzle unit, and the patterning slit sheet may be integrally formed with each other by being coupled to each other by a connection member.

The connection member may guide a flow path of the deposition material.

The connection member may be formed to seal from the outside a space between the deposition source, the deposition source nozzle unit, and the patterning slit sheet.

The continuous depositing of the organic layer of the linear pattern on the substrate may include: providing a thin film deposition apparatus including: a conveyer unit including a transfer unit that fixes the substrate and moves along with the substrate, a first conveyer unit that moves the transfer unit to which the substrate is fixed in a first direction, and a second conveyer unit that moves the transfer unit from which the substrate is separated in a direction opposite to the first direction when the depositing has been completed; a loading unit that fixes the substrate to the transfer unit; a deposition unit including a chamber that is in vacuum, and at least one organic layer deposition assembly that deposits the organic layer on the substrate fixed to the transfer unit transferred from the loading unit; and an unloading unit that separates from the transfer unit the substrate on which the deposition has been completed while passing through the deposition unit, such that the thin film deposition apparatus and the substrate are spaced apart from each other; moving at least one of the thin film deposition apparatus or the substrate relative to the other during the depositing; and spraying the deposition material from the deposition source to be deposited by passing through the patterning slit sheet and forming a pattern on the substrate.

The transfer unit may circulate between the first conveyer unit and the second conveyer unit, and the substrate fixed to the transfer unit may be spaced apart by a distance from the organic layer deposition assembly while being moved by the first conveyer unit.

The first conveyer unit and the second conveyer unit may pass through the deposition unit.

The first conveyer unit and the second conveyer unit may be arranged vertically in parallel.

The first conveyer unit may sequentially move the transfer unit to the loading unit, the deposition unit, and the unloading unit.

The second conveyer unit may sequentially move the transfer unit to the unloading unit, the deposition unit, and the loading unit.

After the forming of the passivation layer, the method may further include removing the organic layer between adjacent panels of a plurality of panels.

The removing of the organic layer between the adjacent panels may include removing the organic layer by chemical etching using plasma containing oxygen ($O_2$).

According to another embodiment of the present invention, an organic light-emitting display apparatus is manufactured by using the above-described method.

According to another embodiment of the present invention, an organic light-emitting display apparatus includes: a substrate; a plurality of thin film transistors that are formed on the substrate and each include a semiconductor active layer, a gate electrode insulated from the semiconductor active layer, and source and drain electrodes contacting the semiconductor active layer; a plurality of first electrodes that are formed on each of the plurality of thin film transistors to be electrically connected to the thin film transistor; a plurality of organic layers that are formed on the plurality of first electrodes; a second electrode that is formed on the plurality of organic layers; and a passivation layer that is formed on the second electrode to cover the second electrode, wherein a length of a hypotenuse of at least one of the plurality of organic layers formed on the substrate farther away from a center of a deposition region is greater than lengths of hypotenuses of the other organic layers formed closer to the center, wherein the at least one of the plurality of organic layers formed on the substrate is a linearly-patterned organic layer formed by using the thin film deposition apparatus of claim 1.

The passivation layer may include at least one material selected from the group consisting of tris(8-hydroxyquinolinato)aluminum ($Alq_3$), a phenylcarbazole-based compound, and a fluorene-based compound.

The substrate may have a size greater than or equal to 40 inches.

The plurality of organic layers may include at least one emission layer.

The organic layers may have a non-uniform thickness.

In each of the organic layers formed farther away from the center of the deposition region, a length of a hypotenuse farther away from the center of the deposition region may be greater than a length of the other hypotenuse.

In the plurality of organic layers disposed in the deposition region, as a distance from the center of the deposition region increases, an overlapped region of two sides that extend in the first direction may be formed narrower.

Hypotenuses of the organic layer disposed at the center of the deposition region may have substantially the same length.

The plurality of organic layers disposed in the deposition region may be symmetrically arranged about the center of the deposition region.

BRIEF DESCRIPTION OF THE DRAWINGS

The above and other features and aspects of the present invention will become more apparent by describing in further detail some exemplary embodiments thereof with reference to the attached drawings, in which.

DETAILED DESCRIPTION

Hereinafter, some exemplary embodiments of the present invention are described in further detail with reference to the accompanying drawings; however, embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art. As those skilled in the art would realize, the described embodiments may be modified in various ways, all without departing from the spirit or scope of the present invention. Expressions such as "at least one of," when preceding a list of elements, modify the entire list of elements and do not modify the individual elements of the list.

Figure 1:
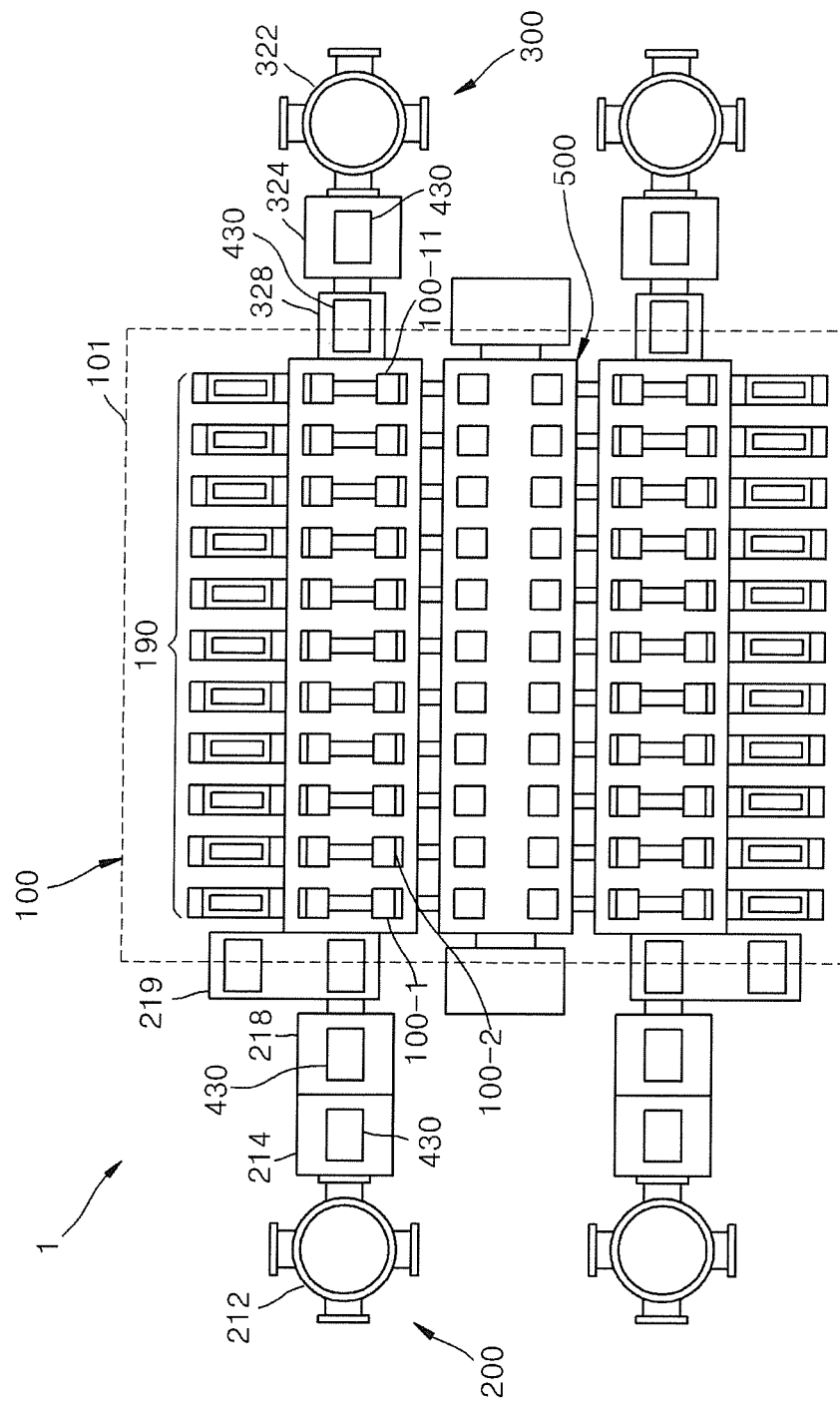
FIG. 1 is a schematic top view of a thin film deposition apparatus according to an embodiment of the present invention.
Figure 2:
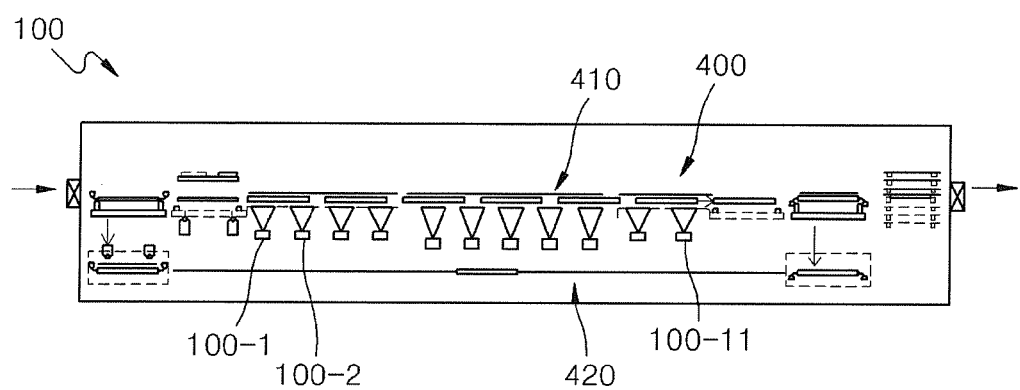
FIG. 2 is a schematic side view of a deposition unit of the thin film deposition apparatus of FIG. 1, according to an embodiment of the present invention.

FIG. 1 is a schematic top view of a thin film deposition apparatus according to an embodiment of the present invention. FIG. 2 is a schematic side view of a deposition unit of the thin film deposition apparatus of FIG. 1, according to an embodiment of the present invention.

Referring to FIGS. 1 and 2, a thin film deposition apparatus 1 according to an embodiment of the present invention includes a deposition unit 100, a loading unit 200, an unloading unit 300, and a conveyer unit 400.

The loading unit 200 may include a first rack 212, a transport chamber 214, a first inversion chamber 218, and a buffer chamber 219.

A plurality of substrates 2 onto which a deposition material has not yet been applied are stacked on the first rack 212 (not shown). A transport robot included in the transport chamber 214 picks up one of the substrates 2 from the first rack 212, disposes it on a transfer unit 430 transferred by a second conveyer unit 420 of the conveyor unit 400, and moves the transfer unit 430 on which the substrate 2 is disposed into the first inversion chamber 218.

The first inversion chamber 218 is disposed adjacent to the transport chamber 214. The first inversion chamber 218 includes a first inversion robot that inverts the transfer unit 430 and then loads it on a first conveyer unit 410 of the conveyor unit 400.

The transport robot of the transport chamber 214 places one of the substrates 2 on a top surface of the transfer unit 430, and the transfer unit 430 on which the substrate 2 is disposed is then transferred into the first inversion chamber 218. The first inversion robot of the first inversion chamber 218 inverts the transfer unit 430 such that the substrate 2 is turned upside down in the deposition unit 100.

The unloading unit 300, in one embodiment, is configured to operate in an opposite manner to the loading unit 200 described above. That is, in one embodiment, a second inversion robot in a second inversion chamber 328 inverts the transfer unit 430, which has passed through the deposition unit 100 while the substrate 2 is disposed on the transfer unit 430, and then moves the transfer unit 430 on which the substrate 2 is disposed into an ejection chamber 324. Then, an ejection robot takes the transfer unit 430 on which the substrate 2 is disposed out of the ejection chamber 324, separates the substrate 2 from the transfer unit 430, and then loads the substrate 2 on a second rack 322. The transfer unit 430, separated from the substrate 2, is returned to the loading unit 200 via the second conveyer unit 420.

However, the present invention is not limited to the above-described embodiment. For example, in another embodiment, when disposing the substrate 2 on the transfer unit 430, the substrate 2 may be fixed onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of organic layer deposition assemblies 100-1, 100-2, . . . , and 100-n are disposed. Referring to FIG. 1, eleven organic layer deposition assemblies, i.e. a first organic layer deposition assembly 100-1, a second organic layer deposition assembly 100-2, . . . , through an eleventh organic layer deposition assembly 100-11, are disposed in the chamber 101. However, in other embodiments, the number of organic layer deposition assemblies may be varied, such as according to a desired deposition material and/or deposition conditions. The chamber 101, in one embodiment, is maintained in vacuum during a deposition process.

In the embodiment illustrated in FIG. 1, the transfer unit 430 with the substrate 2 fixed thereon may be moved at least to the deposition unit 100 or may be moved sequentially to the loading unit 200, the deposition unit 100, and the unloading unit 300, by the first conveyer unit 410, and the transfer unit 430 that is separated from the substrate 2 in the unloading unit 300 may be moved back to the loading unit 200 by the second conveyer unit 420.

In one embodiment, the first conveyer unit 410 passes through the chamber 101 when passing through the deposition unit 100, and the second conveyer unit 420 conveys the transfer unit 430 from which the substrate 2 is separated.

In one embodiment, as shown in FIG. 2, the thin film deposition apparatus 1 is configured such that the first conveyer unit 410 and the second conveyer unit 420 are respectively disposed above and below the organic layer deposition assemblies 100-1, 100-2, . . . , and 100-n such that after the transfer unit 430, on which deposition has been completed while passing through the first conveyer unit 410, is separated from the substrate 2 in the unloading unit 300, the transfer unit 430 is returned to the loading unit 200 via the second conveyer unit 420 formed below the first conveyer unit 410, whereby the thin film deposition apparatus 1 may have improved space utilization efficiency.

In one embodiment, the deposition unit 100 may further include a deposition source replacement unit 190 disposed at a side of each of the organic layer deposition assemblies 100-1, 100-2, . . . , and 100-n. Although not particularly illustrated in the drawings, the deposition source replacement unit 190 may be formed as a cassette-type that may be drawn to the outside from each of the organic layer deposition assemblies 100-1, 100-2, . . . , and 100-n. Thus, a deposition source 110 (see FIG. 3) of the organic layer deposition assembly 100-1 may be easily replaced.

Figure 3:
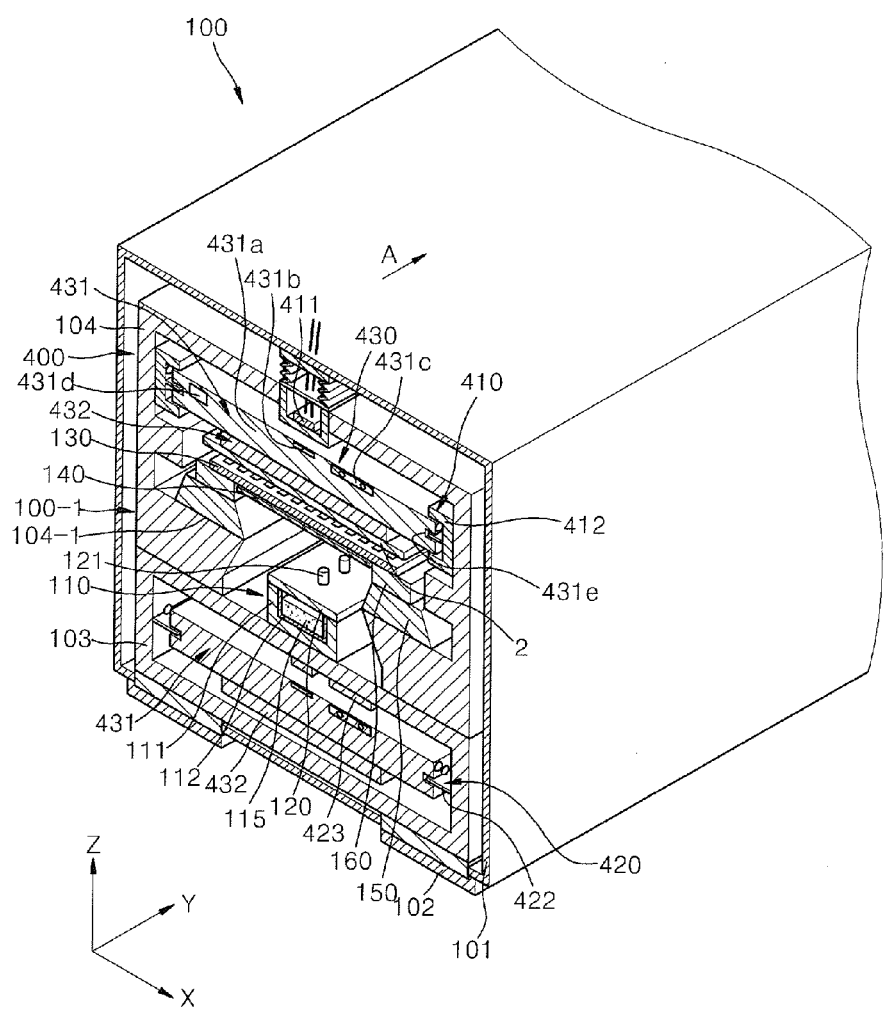
FIG. 3 is a perspective view of a deposition unit of the thin film deposition apparatus of FIG. 1, according to an embodiment of the present invention.
Figure 4:
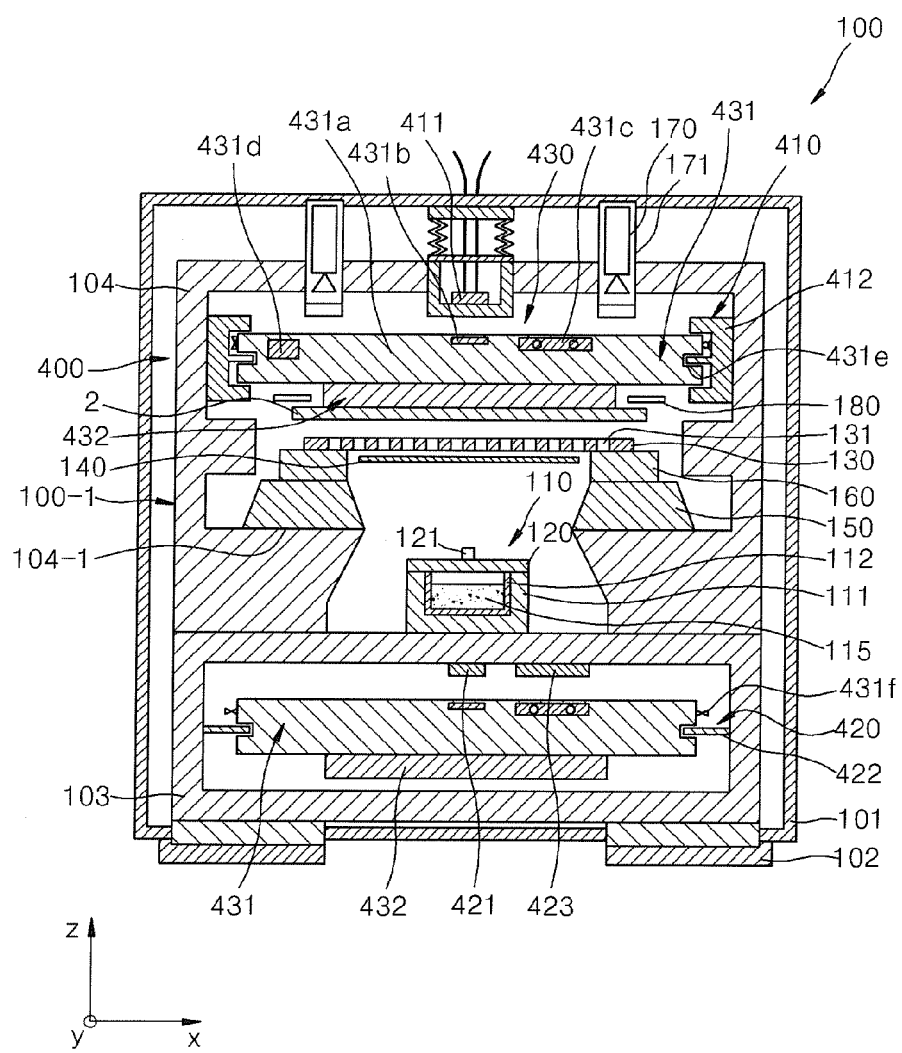
FIG. 4 is a cross-sectional view of the deposition unit of FIG. 3, according to an embodiment of the present invention.
Figure 5:
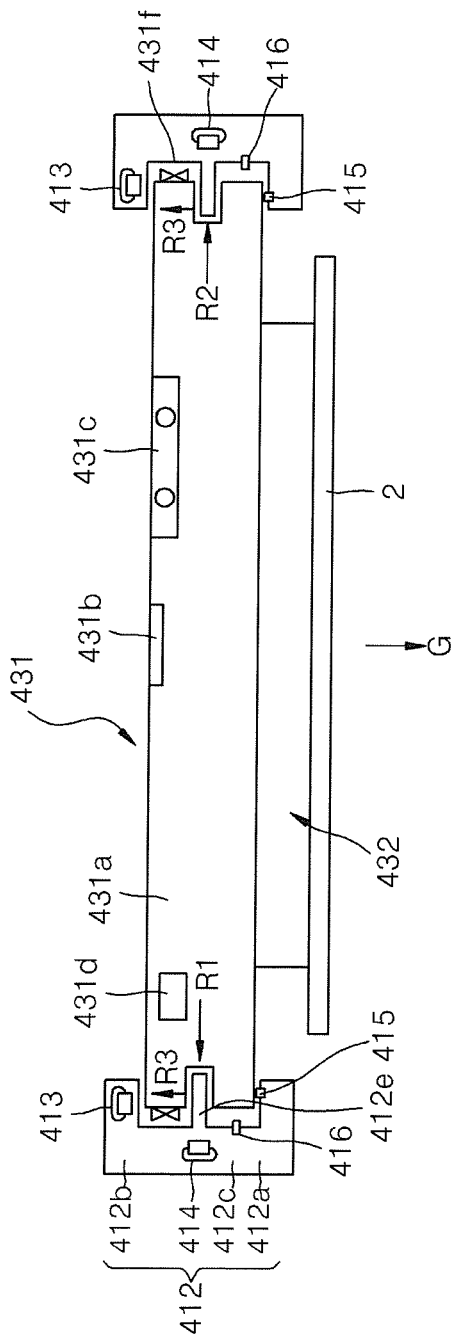
FIG. 5 is a cross-sectional view of a first conveyer unit and a transfer unit of the deposition unit of FIG. 3, according to an embodiment of the present invention.

FIG. 3 is a perspective view of the deposition unit 100 of the thin film deposition apparatus 1, according to an embodiment of the present invention. FIG. 4 is a cross-sectional view of the deposition unit 100, according to an embodiment of the present invention. FIG. 5 is a cross-sectional view of the first conveyer unit 410 and the transfer unit 430 of the deposition unit 100, according to an embodiment of the present invention.

Referring to FIGS. 3 and 4, the deposition unit 100 of the thin film deposition apparatus 1 includes at least one organic layer deposition assembly 100-1 and the conveyer unit 400.

An overall structure of the deposition unit 100 is described further below.

The chamber 101 may be formed as a hollow box type and accommodate the at least one organic layer deposition assembly 100-1 and the conveyor unit 400. In one embodiment, a foot 102 is formed so as to fix the deposition unit 100 on the ground, a lower housing 103 is disposed on the foot 102, and an upper housing 104 is disposed on the lower housing 103. The chamber 101 accommodates both the lower housing 103 and the upper housing 104. In one embodiment, a connection part of the lower housing 103 and the chamber 101 is sealed such that the inside of the chamber 101 is completely isolated from the outside. Due to the structure in which the lower housing 103 and the upper housing 104 are disposed on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

In one embodiment, the upper housing 104 includes the organic layer deposition assembly 100-1 and the first conveyer unit 410 of the conveyer unit 400, and the lower housing 103 includes the second conveyer unit 420 of the conveyer unit 400. While the transfer unit 430 is cyclically moving between the first conveyer unit 410 and the second conveyer unit 420, a deposition process is continuously performed.

Components of the organic layer deposition assembly 100-1 are described below in further detail.

The first organic layer deposition assembly 100-1 includes the deposition source 110, a deposition source nozzle unit 120, a patterning slit sheet 130, a shielding member 140, a first stage 150, a second stage 160, a camera 170, and a sensor 180. In one embodiment, all the elements illustrated in FIGS. 3 and 4 may be arranged in the chamber 101 maintained in an appropriate vacuum state to achieve the linearity of a deposition material.

In one embodiment, in order to deposit a deposition material 115 that has been discharged from the deposition source 110 and passed through the deposition source nozzle unit 120 and the patterning slit sheet 130 onto the substrate 2 in a desired pattern, it is desirable to maintain the chamber 101 in the same vacuum state as that used in a deposition method of an FMM. In addition, it is desirable that a temperature of the patterning slit sheet 130 be sufficiently lower than that of the deposition source 110 (about 100° C. or less) because thermal expansion of the patterning slit sheet 130 by temperatures may be minimized or reduced when the temperature of the patterning slit sheet 130 is sufficiently low.

The substrate 2 on which the deposition material 115 is to be deposited is arranged in the chamber 101. The substrate 2 may be a substrate for a flat panel display apparatus. For example, a large substrate having a size equal to or greater than 40 inches, such as a mother glass, for manufacturing a plurality of flat panel display apparatuses, may be used as the substrate 2.

According to embodiments of the present invention, the deposition process may be performed while at least one of the substrate 2 or the organic layer deposition assembly 100-1 is moved relative to the other. In one embodiment, the deposition process may be performed while the substrate 2 is moved relative to the organic layer deposition assembly 100-1.

In a conventional deposition method using an FMM, the size of the FMM needs to be the same as that of a substrate. Thus, as the size of the substrate increases, the FMM also needs to be large in size. Due to these problems, it is difficult to fabricate the FMM and to align the FMM in a precise pattern by elongation of the FMM.

In the organic layer deposition assembly 100-1 according to an embodiment of the present invention, deposition may be performed while at least one of the organic layer deposition assembly 100-1 or the substrate 2 is moved relative to the other. In other words, deposition may be continuously performed while the substrate 2, which faces the organic layer deposition assembly 100-1, is moved in a direction (e.g., a Y-axis direction). That is, deposition is performed in a scanning manner while the substrate 2 is moved in a direction of arrow "A" illustrated in FIG. 3. Although the substrate 2 is illustrated as being moved in the Y-axis direction in the chamber 101 in FIG. 3 when deposition is performed, the present invention is not limited thereto. For example, in one embodiment, deposition may be performed while the organic layer deposition assembly 100-1 is moved in a direction (e.g., the Y-axis direction) and the substrate 2 is held in a fixed position.

Thus, in the organic layer deposition assembly 100-1, the patterning slit sheet 130 may be much smaller than an FMM used in a conventional deposition method. In other words, in the organic layer deposition assembly 100-1, deposition may be continuously performed, i.e. in a scanning manner, while the substrate 2 is moved in the Y-axis direction. Thus, at least one of the lengths of the patterning slit sheet 130 in X-axis and Y-axis directions may be much less than a length of the substrate 2. Since the patterning slit sheet 130 may be formed much smaller than the FMM used in a conventional deposition method, it is easy to manufacture the patterning slit sheet 130. As such, the small patterning slit sheet 130 is more advantageous in some or all manufacturing processes, including etching followed by precise elongation, welding, transferring, and washing processes, than the FMM used in a conventional deposition method. In addition, this is more advantageous for manufacturing a relatively large display apparatus.

In order to perform deposition while at least one of the organic layer deposition assembly 100-1 or the substrate 2 is moved relative to the other, as described above, the organic layer deposition assembly 100-1 and the substrate 2 are spaced apart from each other by a certain distance. This is described below in further detail.

The deposition source 110 that contains and heats the deposition material 115 is disposed at a side opposite to a side at which the substrate 2 is disposed in the chamber 101. As the deposition material 115 contained in the deposition source 110 is vaporized, deposition is performed on the substrate 2.

In one embodiment, the deposition source 110 includes a crucible 111 in which the deposition material 115 is filled, and a heater 112 that heats the crucible 111 to vaporize the deposition material 115 filled in the crucible 111 toward a side of the crucible 111, specifically, toward the deposition source nozzle unit 120.

The deposition source nozzle unit 120, in one embodiment, is disposed at a side of the deposition source 110 facing the substrate 2. In this regard, the organic layer deposition assemblies according to the present embodiment each may include different deposition nozzles in performing deposition for forming common layers and pattern layers. Although not shown, a plurality of deposition source nozzles 121 may be formed in a direction (e.g., a Y-axis direction), that is, a scanning direction of the substrate 2, on the deposition nozzle unit 120 for forming a pattern layer. In one embodiment, the deposition source nozzle 121 is formed such that only one deposition source nozzle 121 exists in a direction (e.g., an X-axis direction), such that the occurrence of shadows may be greatly reduced. In one embodiment, the plurality of deposition source nozzles 121 may be formed in the X-axis direction on the deposition nozzle unit 120 for forming a common layer. Accordingly, the thickness uniformity of the common layer may be improved.

In one embodiment, the patterning slit sheet 130 may be disposed between the deposition source 110 and the substrate 2. The patterning slit sheet 130 may include a frame having a shape similar to a window frame. The patterning slit sheet 130 includes a plurality of patterning slits 131 arranged in a direction (e.g., the X-axis direction). The deposition material 115 that has been vaporized in the deposition source 110 passes through the deposition source nozzle unit 120 and the patterning slit sheet 130 and is then deposited onto the substrate 2. The patterning slit sheet 130 may be formed using a same method (e.g., etching) as that used to form an FMM, in particular, a stripe-type mask. In one embodiment, a total number of the patterning slits 131 may be more than a total number of the deposition source nozzles 121.

In one embodiment, the deposition source 110 (and the deposition source nozzle unit 120 combined thereto) and the patterning slit sheet 130 may be spaced apart from each other by a certain distance.

As described above, deposition is performed while the organic layer deposition assembly 100-1 is moved relative to the substrate 2. In order for the organic layer deposition assembly 100-1 to be moved relative to the substrate 2, the patterning slit sheet 130 is disposed spaced apart from the substrate 2 by a certain distance.

In a conventional deposition method using an FMM, deposition is performed with the FMM in close contact with a substrate in order to prevent formation of shadows on the substrate. However, when the FMM is formed in close contact with the substrate, defects due to the contact between the substrate and the FMM may occur. In addition, since it is difficult to move the mask with respect to the substrate, the mask and the substrate need to be formed in the same size. Accordingly, the mask needs to be large as the size of a display device increases. However, it is difficult to form a large mask.

In the organic layer deposition assembly 100-1 according to an embodiment of the present invention, the patterning slit sheet 130 is formed spaced apart by a certain distance from the substrate 2 on which a deposition material is to be deposited.

According to embodiments of the present invention, deposition may be performed while a mask formed smaller than a substrate is moved with respect to the substrate, and thus, it is easy to manufacture the mask. In addition, defects due to contact between the substrate and the mask may be prevented or substantially prevented. In addition, since it is unnecessary to closely contact the substrate with the mask during a deposition process, a manufacturing speed may be improved.

A disposition of each element of the upper housing 104 is described further below according to an embodiment of the present invention.

The deposition source 110 and the deposition source nozzle unit 120 are disposed at a bottom portion of the upper housing 104. Accommodation portions 104-1 are respectively formed on both sides of the deposition source 110 and the deposition source nozzle unit 120 to have a protruding shape. In one embodiment, the first stage 150, the second stage 160, and the patterning slit sheet 130 are sequentially arranged on the accommodation portions 104-1.

In one embodiment, the first stage 150 is formed to move in X-axis and Y-axis directions such that the first stage 150 aligns the patterning slit sheet 130 in the X-axis and Y-axis directions. That is, the first stage 150 includes a plurality of actuators such that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is disposed on the first stage 150 and the second stage 160 so as to move in the X-axis, Y-axis, and Z-axis directions, and thus, an alignment, in particular, a real-time alignment, between the substrate 2 and the patterning slit sheet 130 may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 may be sealed by the upper housing 104, the first stage 150, and the second stage 160, and thus, the movement of the deposition material 115 in the X-axis and Y-axis directions may be simultaneously guided thereby.

The shielding member 140 may be disposed between the patterning slit sheet 130 and the deposition source 110 to prevent or substantially prevent an organic material from being deposited on a non-film-forming region of the substrate 2. Although not shown, the shielding member 140 may include two adjacent plates. The non-film-forming region of the substrate 2 is screened by the shielding member 140, and thus, the organic material may be prevented or substantially prevented from being deposited on the non-film-forming region of the substrate 2 without using a separate structure.

The conveyer unit 400 that conveys the substrate 2 on which the deposition material 115 is to be deposited is described in further detail below. Referring to FIGS. 3 and 4, the conveyer unit 400 includes the first conveyer unit 410, the second conveyer unit 420, and the transfer unit 430.

The first conveyer unit 410 conveys in an in-line manner the transfer unit 430, including a carrier 431 and an electrostatic chuck 432 attached thereto, and the substrate 2 attached to the transfer unit 430 such that an organic layer may be formed on the substrate 2 by the organic layer deposition assembly 100-1. The first conveyer unit 410, in one embodiment, includes a coil 411, guide members 412, upper magnetically suspended bearings 413, side magnetically suspended bearings 414, and gap sensors 415 and 416.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420, in one embodiment, includes a coil 421, roller guides 422, and a charging track 423.

The transfer unit 430 includes the carrier 431 that is conveyed along the first conveyer unit 410 and the second conveyer unit 420, and the electrostatic chuck 432 that is combined on a surface of the carrier 431 and to which the substrate 2 is attached.

Components of the conveyer unit 400 are described in further detail below.

The carrier 431 of the transfer unit 430 will now be described in further detail.

The carrier 431, in one embodiment, includes a main body part 431a, a magnetic rail 431b, contactless power supply (CPS) modules 431c, a power supply unit 431d, and guide grooves 431e.

The main body part 431a constitutes a base part of the carrier 431 and may be formed of a magnetic material such as iron. In one embodiment, due to a repulsive force between the main body part 431a and the respective upper and side magnetically suspended bearings 413 and 414, which are described below, the carrier 431 may be maintained spaced apart from the guide members 412 by a certain distance.

The guide grooves 431e may be respectively formed at both sides of the main body part 431a and each may accommodate a guide protrusion 412e of the guide member 412.

The magnetic rail 431b may be formed along a centerline of the main body part 431a in a direction in which the main body part 431a proceeds. The magnetic rail 431b and the coil 411, which are described below, may be combined with each other to constitute a linear motor, and the carrier 431 may be conveyed in a direction of arrow "A" direction by the linear motor.

The CPS modules 431c and the power supply unit 431d may be respectively formed at both sides of the magnetic rail 431b in the main body part 431a. The power supply unit 431d may be a battery for charging that provides power such that the electrostatic chuck 432 chucks the substrate 2 and maintains operation. The CPS modules 431c may be a wireless charging module that charges the power supply unit 431d. In one embodiment, the charging track 423 formed in the second conveyer unit 420, which is described below, is connected to an inverter (not shown), and thus, when the carrier 431 is transferred to the second conveyer unit 420, a magnetic field is formed between the charging track 423 and the CPS modules 431c so as to supply power to the CPS module 431c. The power supplied to the CPS modules 431c is used to charge the power supply unit 431d.

The electrostatic chuck 432 may include an electrode embedded in a main body formed of ceramic, wherein the electrode is supplied with power. The substrate 2 is attached onto a surface of the main body of the electrostatic chuck 432 as a high voltage is applied to the electrode.

An operation of the transfer unit 430 is described in further detail below.

The magnetic rail 431b of the main body part 431a and the coil 411 may be combined with each other to constitute an operation unit. The operation unit may be a linear motor. The linear motor has a small frictional coefficient, little position error, and a very high degree of position determination, as compared to a conventional slide guide system. As described above, the linear motor may include the coil 411 and the magnetic rail 431b. The magnetic rail 431b is linearly disposed on the carrier 431, and a plurality of the coils 411 may be disposed at an inner side of the chamber 101 by a certain distance so as to face the magnetic rail 431b. Since the magnetic rail 431b is disposed on the carrier 431 instead of the coil 411, the carrier 431 may be operable without power being supplied thereto. In this regard, the coil 411 may be formed in an atmosphere (ATM) box and the carrier 431 to which the magnetic rail 431b is attached may be moved in the chamber 101 maintained in vacuum.

The first conveyer unit 410 and the transfer unit 430 are described in further detail below.

Referring to FIG. 5, the first conveyer unit 410 conveys the electrostatic chuck 432 that fixes the substrate 2 and conveys the carrier 431 that conveys the electrostatic chuck 432. In one embodiment, the first conveyer unit 410 includes the coil 411, the guide members 412, the upper magnetically suspended bearings 413, the side magnetically suspended bearings 414, and the gap sensors 415 and 416.

The coil 411 and the guide members 412 are formed inside the upper housing 104. The coil 411 is formed at an upper portion of the upper housing 104, and the guide members 421 are respectively formed at both inner sides of the upper housing 104.

The guide members 412 guide the carrier 431 to move in a direction. The guide members 412 are formed to pass through the deposition unit 100.

The side magnetically suspended bearings 414 are each disposed in a connection part 412c of the guide member 412 so as to respectively correspond to both sides of the carrier 431. The side magnetically suspended bearings 414 cause a distance between the carrier 431 and the guide member 412 such that the carrier 431 is moved along the guide members 412 in non-contact with the guide members 412. That is, a repulsive force R1 occurring between the side magnetically suspended bearing 414 on the left side in FIG. 5 and the carrier 431, which is a magnetic material, and a repulsive force R2 occurring between the side magnetically suspended bearing 414 on the right side in FIG. 5 and the carrier 431, which is a magnetic material, maintain equilibrium, and thus, there is a constant or substantially constant distance between the carrier 431 and the respective guide members 412.

Each upper magnetically suspended bearing 413 may be disposed in a second accommodation part 412b of the guide member 412 so as to be above the carrier 431. The upper magnetically suspended bearings 413 enable the carrier 431 to be moved along the guide members 412 in non-contact with the second accommodation part 412b and a first accommodation part 412a of the guide member 412 and with a distance therebetween maintained constant or substantially constant. That is, a repulsive force R3 occurring between the upper magnetically suspended bearing 413 and the carrier 431, which is a magnetic material, and gravity G maintain equilibrium, and thus, there is a constant or substantially constant distance between the carrier 431 and the respective guide members 412.

Each guide member 412 may further include the gap sensor 415. The gap sensor 415 may measure a distance between the carrier 431 and the guide member 412. The gap sensor 416 may be disposed at a side of the side magnetically suspended bearing 414. The gap sensor 416 may measure a distance between a side surface of the carrier 431 and the side magnetically suspended bearing 414.

Magnetic forces of the upper and side magnetically suspended bearings 413 and 414 may vary according to values measured by the gap sensors 415 and 416, and thus, distances between the carrier 431 and the respective guide members 412 may be adjusted in real time. That is, a precise transfer of the carrier 431 may be feedback controlled using the upper and side magnetically suspended bearings 413 and 414 and the gap sensors 415 and 416.

The second conveyer unit 420 and the transfer unit 430 are described in further detail below.

Referring back to FIG. 4, the second conveyer unit 420 returns the electrostatic chuck 432 from which the substrate 2 has been separated in the unloading unit 300 and the carrier 431 that carries the electrostatic chuck 432 to the loading unit 200. In one embodiment, the second conveyer unit 420 includes the coil 421, the roller guides 422, and the charging track 423.

In one embodiment, the coil 421, the roller guides 422, and the charging track 423 may be positioned inside the lower housing 103. The coil 421 and the charging track 423 may be disposed at a top inner surface of the lower housing 103, and the roller guides 422 may be disposed at both inner sides of the lower housing 103. The coil 421 may be disposed in an ATM box, as the coil 411 of the first conveyer unit 410.

Like the first conveyer unit 410, the second conveyer unit 410 may also include the coil 421, and the magnetic rail 431b of the main body part 431a of the carrier 431 and the coil 421 are combined with each other to constitute an operation unit. In this regard, the operation unit may be a linear motor. The carrier 431 may be moved by the linear motor along a direction opposite to the direction of arrow "A" illustrated in FIG. 3.

The roller guides 422 guide the carrier 431 to move in a direction. In one embodiment, the roller guides 422 are formed to pass through the deposition unit 100.

The second conveyer unit 420 is used in a process of returning the carrier 431 from which the substrate 2 has been separated and not in a process of depositing an organic material on the substrate 2, and thus, positional accuracy thereof may be less than that of the first conveyer unit 410. Therefore, magnetic suspension is applied to the first conveyer unit 410, thereby obtaining high positional accuracy, and a conventional roller method may be applied to the second conveyer unit 420 that requires relatively low positional accuracy, thereby reducing manufacturing costs and simplifying a structure of the organic layer deposition apparatus. Although not illustrated in FIG. 4, the magnetic suspension may also be applied to the second conveyer unit 420 as in the first conveyer unit 410.

The organic layer deposition assembly 100-1 of the thin film deposition apparatus 1 according to an embodiment of the present invention may further include the camera 170 and the sensor 180 for an aligning process. The camera 170 may align in real time a first alignment mark (not shown) formed in a frame of the patterning slit sheet 130 and a second alignment mark (not shown) formed on the substrate 2. The sensor 180 may be a confocal sensor. Since a distance between the substrate 2 and the patterning slit sheet 130 is measurable in real time using the camera 170 and the sensor 180, the substrate 2 may be aligned with the patterning slit sheet 130 in real time, whereby positional accuracy of a pattern may be significantly improved.

A thin film such as an organic layer of an organic light-emitting display apparatus may be formed by using the thin film deposition apparatus 1 which will be explained in further detail with reference to FIG. 14.

Figure 6:
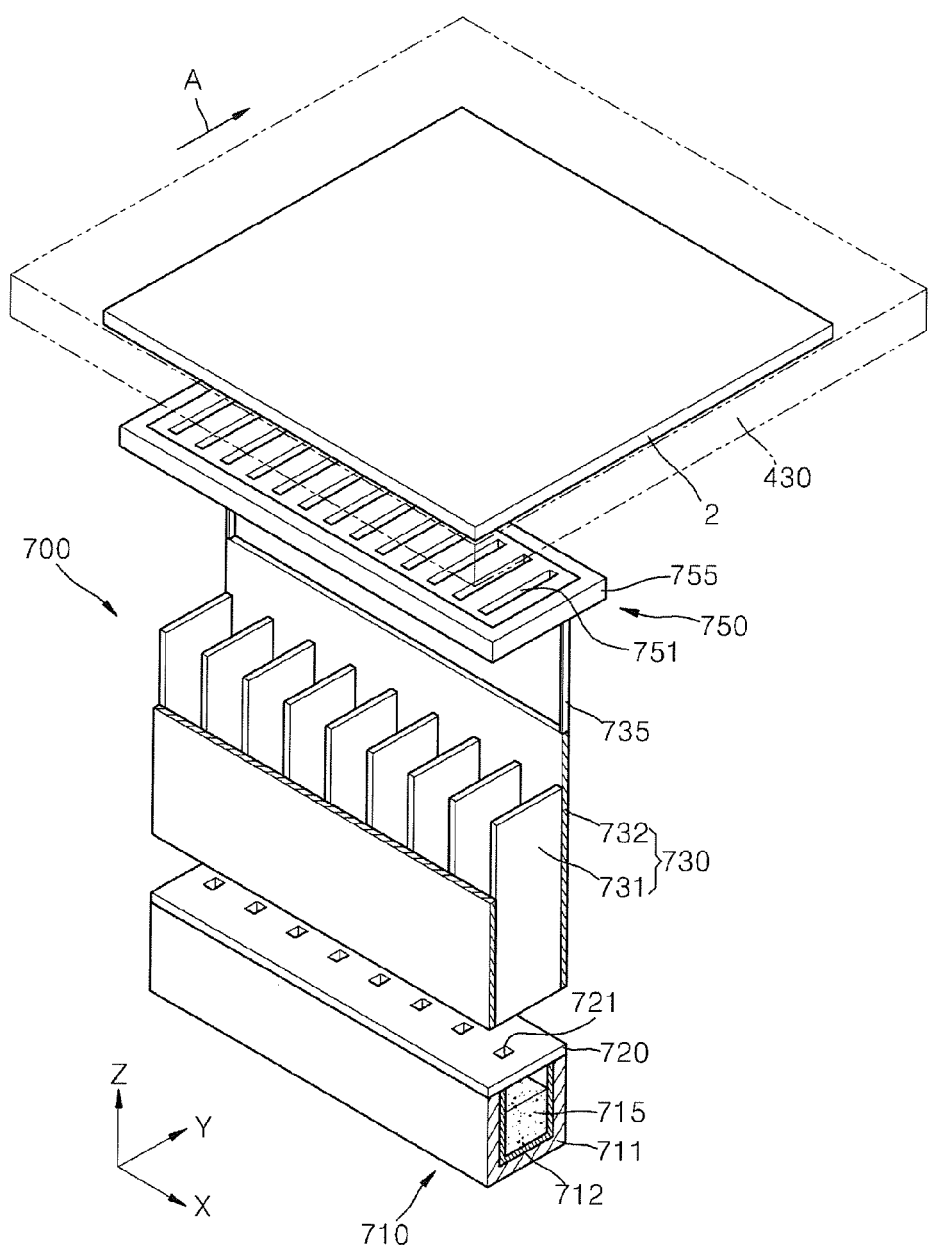
FIG. 6 is a perspective view of an organic layer deposition assembly according to an embodiment of the present invention.
Figure 7:
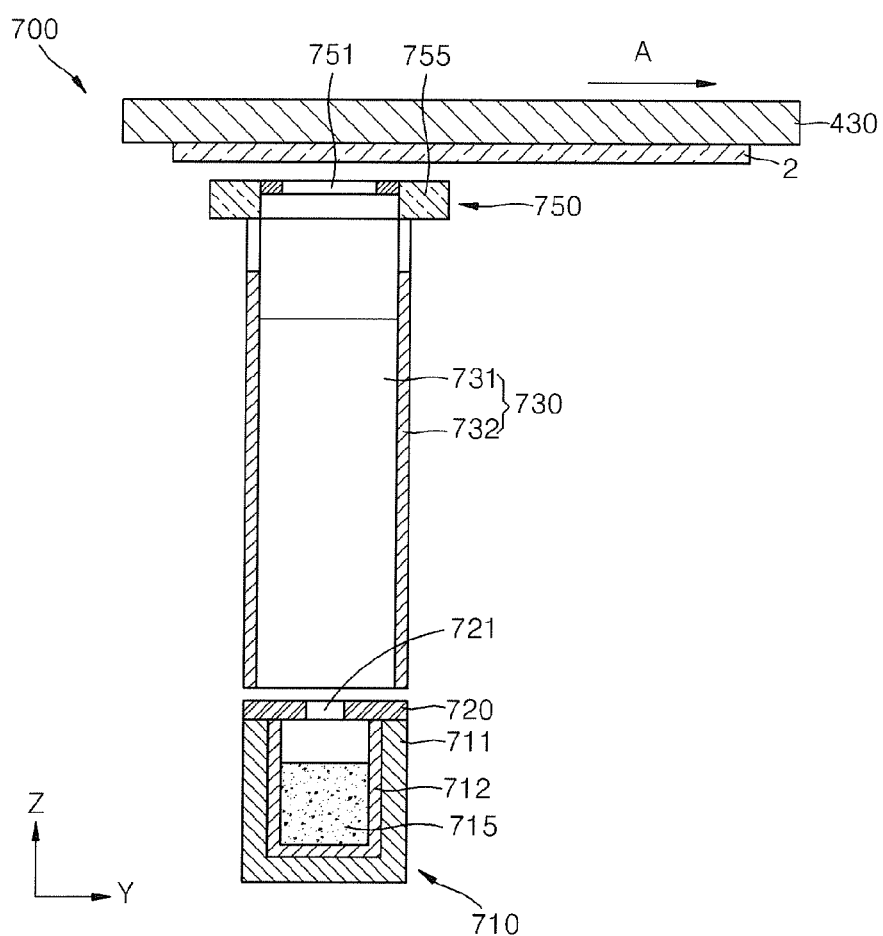
FIG. 7 is a side cross-sectional view of the organic layer deposition assembly of FIG. 6.
Figure 8:
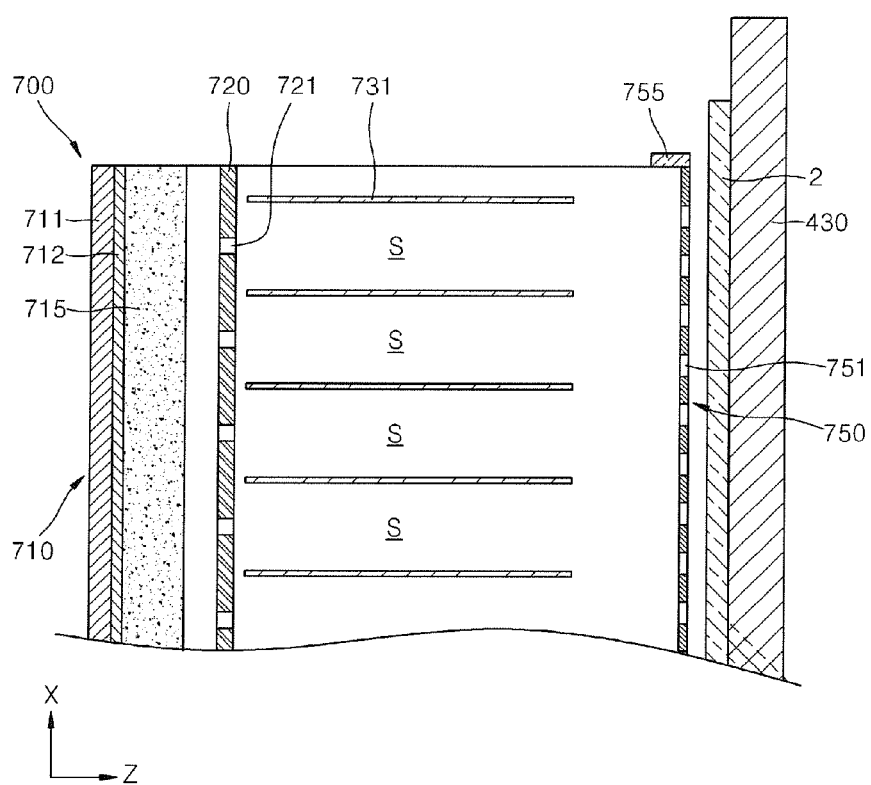
FIG. 8 is a front cross-sectional view of the organic layer deposition assembly of FIG. 6.

FIG. 6 is a perspective view of an organic layer deposition assembly according to an embodiment of the present invention. FIG. 7 is a side cross-sectional view of the organic layer deposition assembly of FIG. 6. FIG. 8 is a front cross-sectional view of the organic layer deposition assembly of FIG. 6.

Referring to FIGS. 6 through 8, an organic layer deposition assembly 700 according to an embodiment of the present invention includes a deposition source 710, a deposition source nozzle unit 720, a shielding plate assembly 730, and a patterning slit sheet 750.

The deposition source 710 includes a crucible 711 in which a deposition material 715 is filled, and a heater 712 that heats the crucible 711 and vaporizes the deposition material 715 filled in the crucible 711 toward the deposition source nozzle unit 720. The deposition source nozzle unit 720 is disposed at a side of the deposition source 710, and a plurality of nozzles 721 are formed in the deposition source nozzle unit 720 in a direction (e.g., an X-axis direction).

The shielding plate assembly 730 is disposed at a side of the deposition source nozzle unit 720. The shielding plate assembly 730 includes a plurality of shielding plates 731, and a shielding plate frame 732 disposed outside the shielding plates 731. The plurality of shielding plates 731 may be disposed in parallel in the X-axis direction. The plurality of shielding plates 731 may be formed at equal intervals. Also, each of the shielding plates 731 may extend on a Y-Z plane shown in FIG. 6, and may have a rectangular shape. The plurality of shielding plates 731 divide a space between the deposition source nozzle unit 720 and the patterning slit sheet 750 into a plurality of deposition spaces S (see FIG. 8). That is, in the organic layer deposition assembly 700, a space is divided into the deposition spaces S by the shielding plates 731 according to the deposition source nozzles 721 through which the deposition material 715 is sprayed. As such, since a space between the deposition source 710, the deposition source nozzle unit 720, and the patterning slit sheet 750 is divided by the shielding plates 731 into the plurality of deposition spaces S, the deposition material 715 discharged from one deposition source nozzle 721 is not mixed with the deposition materials 715 discharged from the other deposition source nozzles 721, and is deposited on the substrate 2 by passing through the patterning slit 751. That is, the shielding plates 731 guide a flow path of the deposition material 715 such that the deposition material 715 discharged from each of the deposition source nozzles 721 is straightly moved in a Z-axis direction without being scattered.

As such, since the shielding plates 731 provide linearity in the deposition material 715, a size of a shadow formed on the substrate 2 may be significantly reduced. Accordingly, the organic layer deposition assembly 700 and the substrate 2 may be spaced apart from each other by a certain distance.

The patterning slit sheet 750 is further provided between the deposition source 710 and the substrate 2. The patterning slit sheet 750 further includes a frame 755 that has a shape similar to a window frame, and the plurality of patterning slits 751 are formed in the patterning slit sheet 750 in a direction (e.g., the X-axis direction). The deposition material 715 vaporized in the deposition source 710 passes through the deposition source nozzle unit 720 and the patterning slit sheet 750 and is deposited onto the substrate 2.

Figure 9:
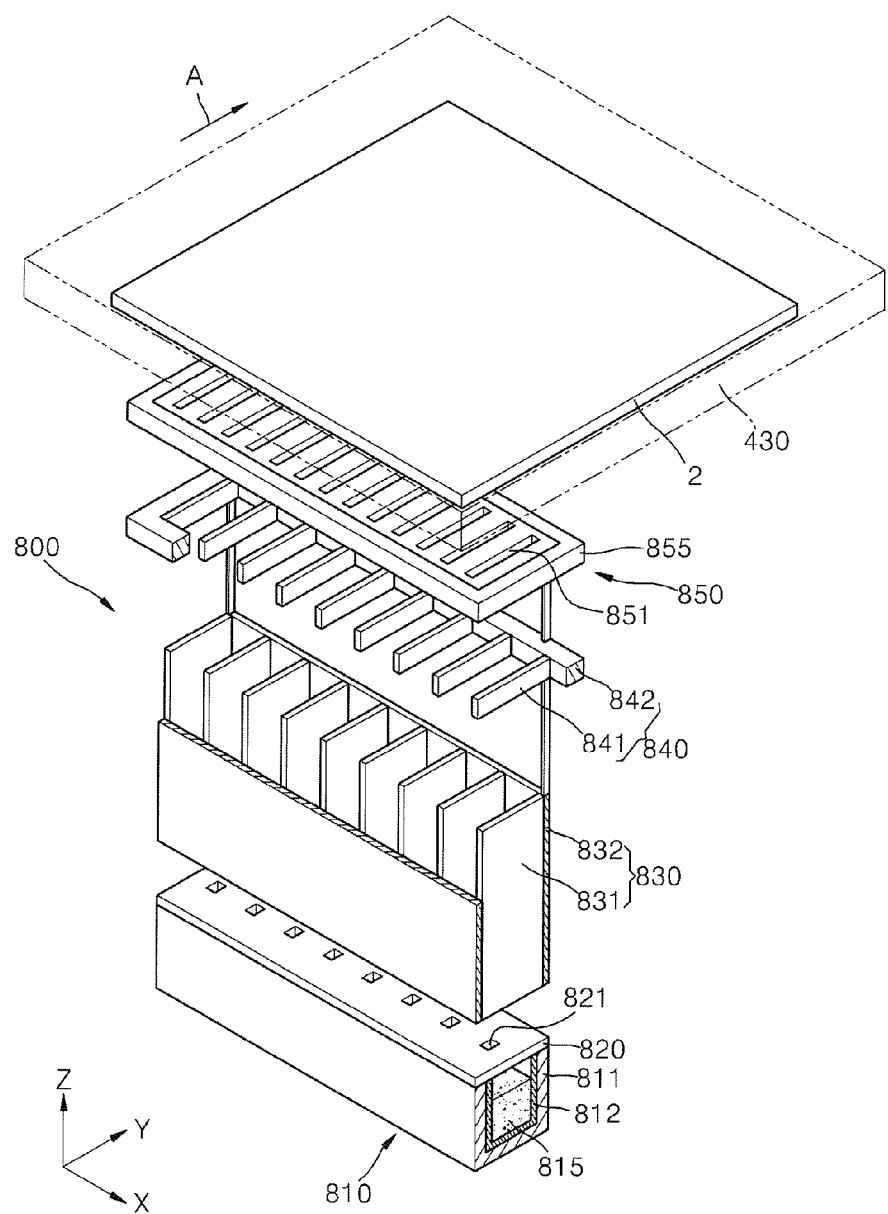
FIG. 9 is a perspective view of an organic layer deposition assembly according to another embodiment of the present invention.

FIG. 9 is a perspective view of an organic layer deposition assembly according to another embodiment of the present invention.

Referring to FIG. 9, an organic layer deposition assembly 800 according to another embodiment of the present invention includes a deposition source 810, a deposition source nozzle unit 820, a first shielding plate assembly 830, a second shielding plate assembly 840, and a patterning slit sheet 850. The deposition source 810 including a crucible 811 in which a deposition material 815 is filled, and a heater 812 that heats the crucible 811 and vaporizes the deposition material 815 filled in the crucible 811; the deposition source nozzle unit 820; the first shielding plate assembly 830 including a plurality of first shielding plates 831 and a shielding plate frame 832; and the patterning slit sheet 850 including a frame 855 may be the same or similar to those of the organic layer deposition assembly 700 described above, and thus a detailed explanation thereof will not be given. The organic layer deposition assembly 800 is different from the organic layer deposition assembly 700 described above in that the second shielding plate assembly 840 is disposed at a side of the first shielding plate assembly 830.

In one embodiment, the second shielding plate assembly 840 includes a plurality of second shielding plates 841, and a second shielding plate frame 842 that is disposed outside the second shielding plates 841. The second shielding plates 841 may be disposed in parallel in an X-axis direction. In one embodiment, the second shielding plates 841 may be formed at equal intervals. Also, each of the second shielding plates 841 may be formed to be parallel to a Y-Z plane shown in FIG. 9, such as to be perpendicular to the X-axis direction.

The plurality of first shielding plates 831 and the second shielding plates 841 disposed in such a manner divide a space between the deposition source nozzle unit 820 and the patterning slit sheet 850. That is, due to the first shielding plates 831 and the second shielding plates 841, a space is divided into a plurality of deposition spaces according to deposition source nozzles 821 through which a deposition material 815 is sprayed.

The second shielding plates 841 may be disposed to respectively correspond to the first shielding plates 831 in a one-to-one manner. In one embodiment, the second shielding plates 841 and the first shielding plates 831 may be aligned with each other to be parallel to each other. That is, the first shielding plates 831 and the second shielding plates 841 which correspond to each other may be disposed on a same plane. Although lengths of the first shielding plates 831 and widths of the second shielding plates 841 in the X-axis direction appear the same in FIG. 9, the present invention is not limited thereto. That is, the second shielding plates 841 which are required to be precisely aligned with patterning slits 851 of the patterning slit sheet 850 may be formed to be relatively thin, and the first shielding plates 831 which are not required to be precisely aligned may be formed to be relatively thick, thereby facilitating a manufacturing process.

Figure 10:
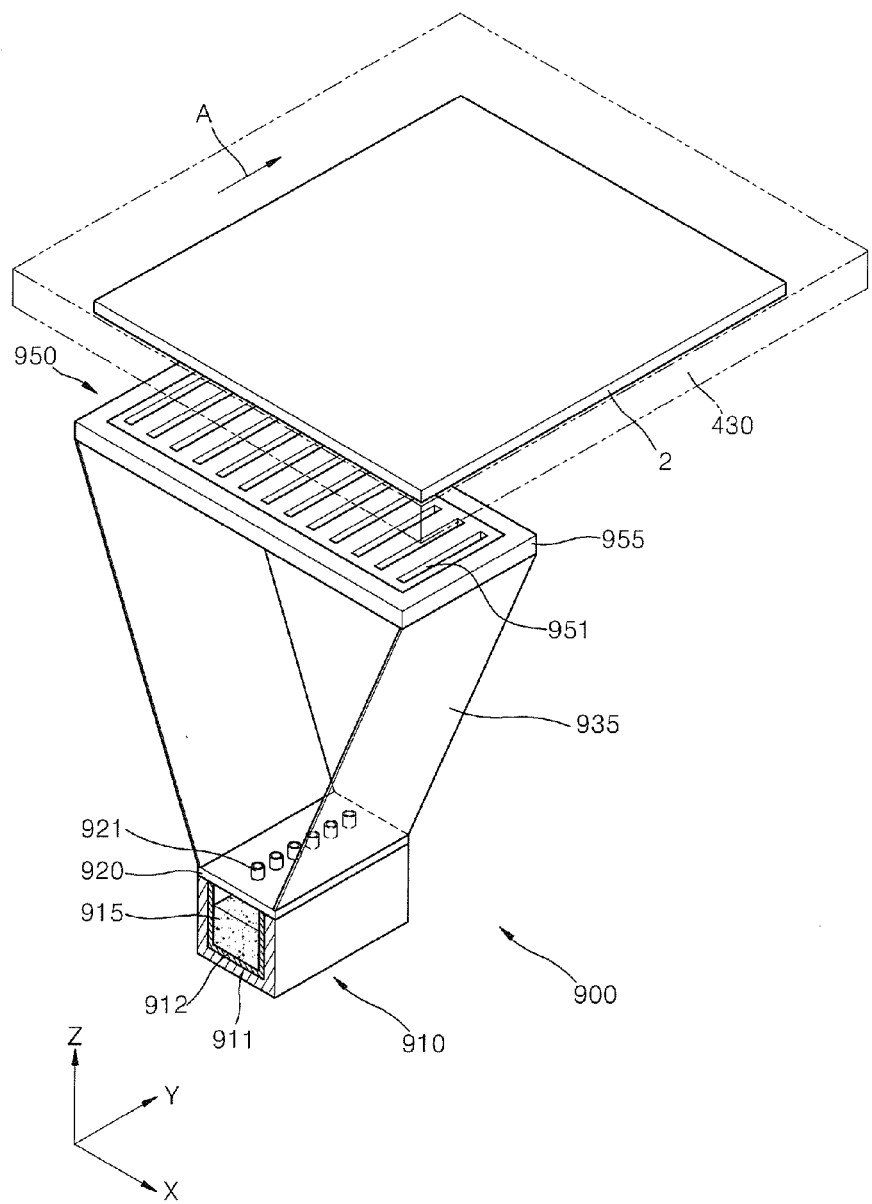
FIG. 10 is a perspective view of an organic layer deposition assembly according to another embodiment of the present invention.

FIG. 10 is a perspective view of an organic layer deposition assembly according to another embodiment of the present invention.

Referring to FIG. 10, an organic layer deposition assembly 900 according to another embodiment of the present invention includes a deposition source 910, a deposition source nozzle unit 920, and a patterning slit sheet 950.

The deposition source 910 includes a crucible 911 in which a deposition material 915 is filled, and a heater 912 that heats the crucible 911 and vaporizes the deposition material 915 filled in the crucible 911 toward the deposition source nozzle unit 920. The deposition source nozzle unit 920 is disposed at a side of the deposition source 910, and a plurality of deposition source nozzles 921 are formed in the deposition source nozzle unit 920 in a direction (e.g., a Y-axis direction). The patterning slit sheet 950 and a frame 955 are further provided between the deposition source 910 and the substrate 2, and a plurality of patterning slits 951 and spacers 952 are formed in and on the patterning slit sheet 950 in an X-axis direction. The deposition source 910, the deposition source nozzle unit 920, and the patterning slit sheet 950 are coupled to each other by a connection member 935.

An arrangement of the plurality of deposition source nozzles 921 of the deposition source nozzle unit 920 is different from those in the previously described embodiments, and thus further explanation thereof is provided below.

The deposition source nozzle unit 920 is disposed at a side of the deposition source 910, that is, a side of the deposition source 910 facing the substrate 2. The plurality of deposition source nozzles 921 are formed in the deposition source nozzle unit 920 in the Y-axis direction, that is, in a scanning direction of the substrate 2. In one embodiment, the plurality of deposition source nozzles 921 may be formed at equal intervals. The deposition material 915 vaporized in the deposition source 910 passes through the deposition source nozzles unit 920 and is deposited onto the substrate 2. As a result, the deposition source nozzles 921 are formed in the scanning direction of the substrate 2 in the organic layer deposition assembly 900. In this case, when the deposition source nozzles 921 are provided in the X-axis direction, distances between the deposition source nozzles 921 and the patterning slits 951 are different and a shadow occurs due to the deposition material 915 sprayed from the deposition source nozzle 921 far away from the patterning slit 951. Accordingly, since only one deposition source nozzle 921 is formed to exist in the X-axis direction, shadows may be greatly reduced. Also, since the plurality of deposition source nozzles 921 exist in the scanning direction, even when there is a flux difference between individual deposition source nozzles, the flux difference may be offset and deposition uniformity may be kept constant.

A structure of an organic layer formed on a thin film deposition apparatus will now be explained in further detail.

Figure 11:
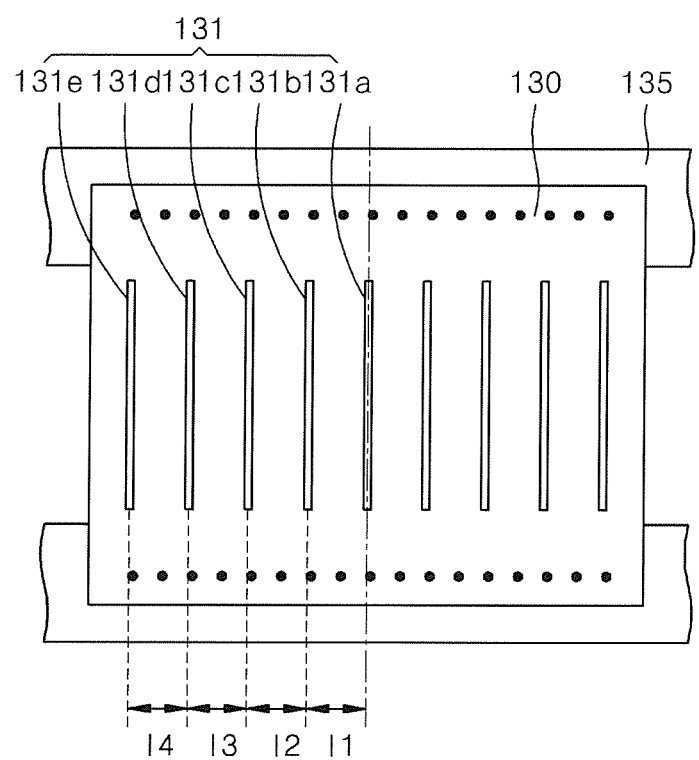
FIG. 11 is a schematic top view of a patterning slit sheet of an organic layer deposition assembly, according to an embodiment of the present invention.
Figure 12:
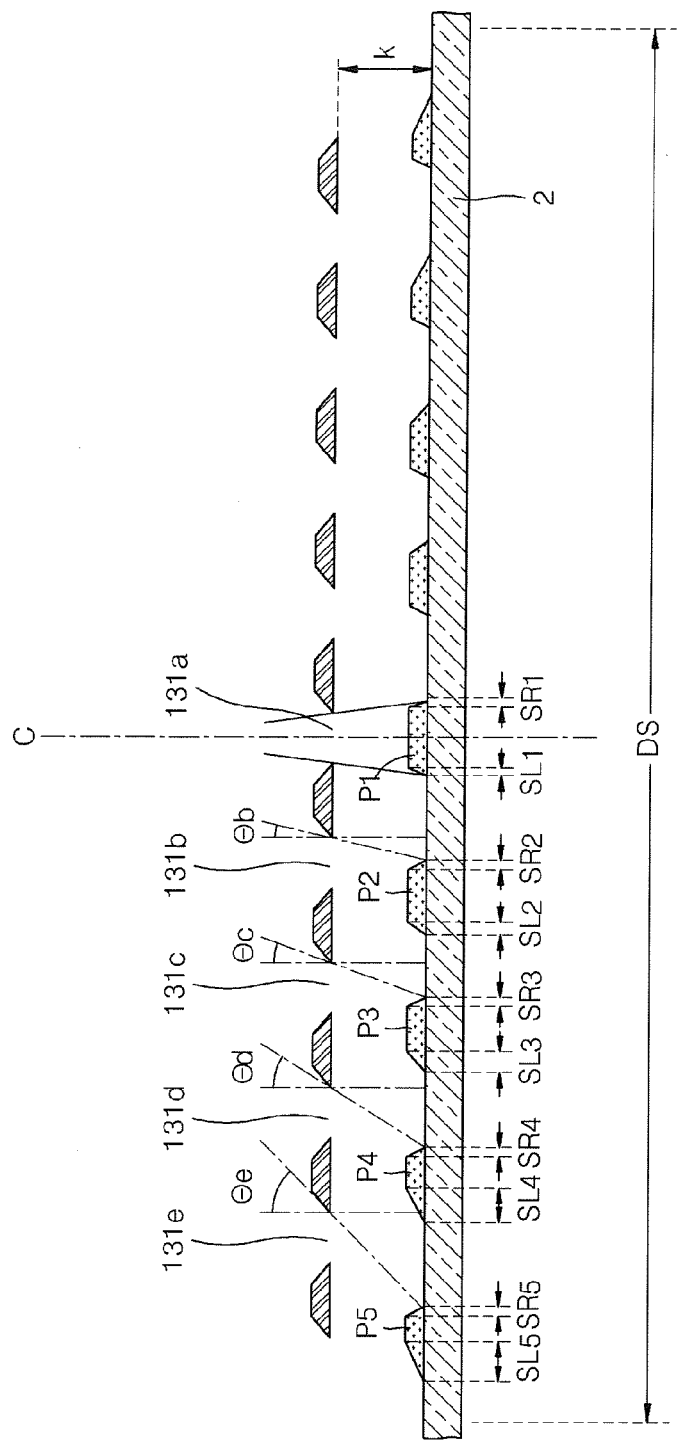
FIG. 12 is a schematic cross-sectional view illustrating organic layers formed on a substrate by using the patterning slit sheet of FIG. 11, according to an embodiment of the present invention.

FIG. 11 is a schematic top view of a patterning slit sheet of an organic layer deposition assembly, according to an embodiment of the present invention. FIG. 12 is a schematic cross-sectional view illustrating organic layers formed on a substrate by using the patterning slit sheet of FIG. 11, according to an embodiment of the present invention.

FIGS. 11 and 12 illustrate the patterning slit sheet 130 in which the patterning slits 131 are arranged at equal intervals. That is, in one embodiment, an arrangement of the patterning slits 131 satisfies the following condition: $I_2=I_2=I_3=I_4$.

As shown in FIG. 12, in one embodiment, an incident angle of a deposition material discharged along a centerline C of a deposition space DS is substantially perpendicular to the substrate 2. Thus, an organic layer $P_1$ formed using the deposition material that has passed through a patterning slit 131a has a minimal size of a shadow, and a right-side shadow $SR_1$ and a left-side shadow $SL_1$ are formed symmetrical or substantially symmetrical to each other.

However, an incident angle of the deposition material that passes through patterning slits disposed farther from the centerline C of the deposition space DS gradually increases as a distance from the centerline C increases, and, in one embodiment, an incident angle $\theta_e$ of the deposition material that passes through an outermost patterning slit 131e is approximately 55°. Accordingly, the deposition material is incident at an inclination with respect to the patterning slit 131e, and an organic layer $P_5$ formed using the deposition material that has passed through the patterning slit 131e has the largest shadow. In particular, a left-side shadow $SR_5$ is larger than a right-side shadow $SR_5$.

That is, as the incident angle of the deposition material increases, the size of the shadow also increases. In particular, the size of the shadow at positions farther from the centerline C of the deposition space DS increases. In addition, the incident angle of the deposition material increases as a distance between the centerline C of the deposition space DS and the respective patterning slits increases. Thus, organic layers formed using the deposition material that passes through the patterning slits disposed farther from the centerline C of the deposition space DS have a larger shadow size. In particular, of the shadows on both sides of the respective organic layers, the size of the shadow at a side farther from the centerline C of the deposition space DS is larger than that of the side nearer to the centerline C.

That is, referring to FIG. 12, the organic layers formed on the left side of the centerline C of the deposition space DS have a structure in which a left hypotenuse is longer than a right hypotenuse, and the organic layers formed on the right side of the centerline C of the deposition space DS have a structure in which a right hypotenuse is longer than a left hypotenuse.

In addition, in the organic layers formed on the left side of the centerline C of the deposition space DS, the lengths of the left hypotenuses increase toward the left. In the organic layers formed on the right side of the centerline C of the deposition space DS, the lengths of the right hypotenuses increase toward the right. Consequently, the organic layers formed in the deposition space DS may be formed symmetrical or substantially symmetrical to each other about the centerline C of the deposition space DS.

This structure will now be described in further detail.

The deposition material that passes through a patterning slit 131b passes through the patterning slit 131b at an incident angle $\theta_b$, and an organic layer $P_2$ formed using the deposition material that has passed through the patterning slit 131b has a left-side shadow having a size $SL_2$. Similarly, the deposition material that passes through a patterning slit 131c passes through the patterning slit 131c at an incident angle $\theta_c$, and an organic layer $P_3$ formed using the deposition material that has passed through the patterning slit 131c has a left-side shadow having a size $SL_3$. Similarly, the deposition material that passes through a patterning slit 131d passes through the patterning slit 131d at an incident angle $\theta_d$, and an organic layer $P_4$ formed using the deposition material that has passed through the patterning slit 131d has a left-side shadow having a size $SL_4$. Similarly, the deposition material that passes through the patterning slit 131e passes through the patterning slit 131e at an incident angle $\theta_e$, and an organic layer $P_5$ formed using the deposition material that has passed through the patterning slit 131e has a left-side shadow having a size $SL_5$.

In this regard, the incident angles satisfy the following condition: $\theta_b < \theta_c < \theta_d < \theta_e$, and thus, the sizes of the shadows of the organic layers also satisfy the following condition: $SL_1 < SL_2 < SL_3 < SL_4 < SL_5$.

Figure 13:
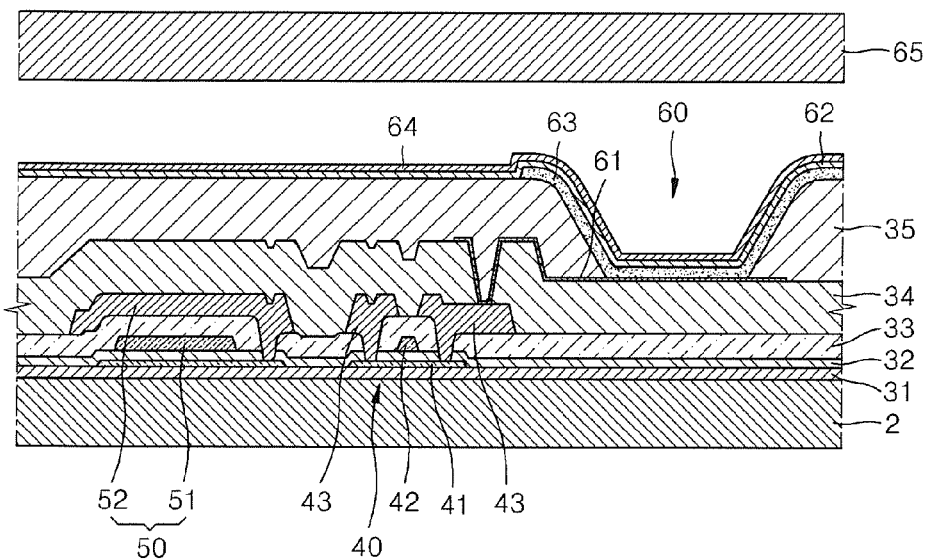
FIG. 13 is a cross-sectional view of an organic light-emitting display apparatus manufactured by using a thin film deposition apparatus, according to an embodiment of the present invention.

FIG. 13 is a cross-sectional view of an organic light-emitting display apparatus manufactured by using a thin film deposition apparatus, such as the thin film deposition apparatus 1 described above, according to an embodiment of the present invention.

Referring to FIG. 13, an organic light-emitting display device 10 (e.g., an active matrix-type organic light-emitting display device) according to an embodiment of the present invention is formed on the substrate 2. The substrate 2 may be formed of a transparent material, for example, glass, plastic, or metal. An insulating layer 31, such as a buffer layer, may be formed on an entire surface of the substrate 2.

In one embodiment, a thin film transistor (TFT) 40, a capacitor 50, and an organic light-emitting diode (OLED) 60 are disposed on the insulating layer 31, as illustrated in FIG. 13.

A semiconductor active layer 41 may be formed on an upper surface of the insulating layer 31 in a predetermined pattern. A gate insulating layer 32 may be formed to cover the semiconductor active layer 41. The semiconductor active layer 41 may include a p-type or n-type semiconductor material.

In one embodiment, a gate electrode 42 of the TFT 40 is formed in a region of the gate insulating layer 32 corresponding to the semiconductor active layer 41. An interlayer insulating layer 33 may be formed to cover the gate electrode 42. The interlayer insulating layer 33 and the gate insulating layer 32 may be etched, such as by dry etching, to form a contact hole exposing parts of the semiconductor active layer 41.

In one embodiment, source/drain electrodes 43 are formed on the interlayer insulating layer 33 to contact the semiconductor active layer 41 through the contact hole. In one embodiment, a passivation layer 34 is formed to cover the source/drain electrodes 43, and is etched to expose a part of one of the source/drain electrodes 43. An insulating layer (not shown) may be further formed on the passivation layer 34 so as to planarize the passivation layer 34.

The OLED 60 may display predetermined image information by emitting red, green, or blue light according to current. The OLED 60 includes a first electrode 61 disposed on the passivation layer 34. The first electrode 61 is electrically connected to the exposed source/drain electrode 43 of the TFT 40.

A pixel-defining layer 35 is formed to cover the first electrode 61. An opening is formed in the pixel-defining layer 35, and an organic layer 63 including an emission layer (EML) is formed in a region defined by the opening. A second electrode 62 is formed on the organic layer 63.

The pixel-defining layer 35, which defines individual pixels, is formed of an organic material. The pixel-defining layer 35 also planarizes a surface of a region of the substrate 30 in which the first electrode 61 is formed, and, in particular, a surface of the passivation layer 34.

The first electrode 61 and the second electrode 62 are insulated from each other, and respectively apply voltages of opposite polarities to the organic layer 63 to induce light emission.

The organic layer 63, including an EML, may be formed of a low-molecular weight organic material or a high-molecular weight organic material. When a low-molecular weight organic material is used, the organic layer 63 may have a single or multi-layer structure including a hole injection layer (HIL), a hole transport layer (HTL), the EML, an electron transport layer (ETL), or an electron injection layer (EIL). Non-limiting examples of available organic materials include copper phthalocyanine (CuPc), N,N'-di(naphthalene-1-yl)-N,N'-diphenyl-benzidine (NPB), and tris-8-hydroxyquinoline aluminum ($Alq_3$).

The organic layer 63 including an EML may be formed using the thin film deposition apparatus 1 illustrated in FIGS. 1 through 11. That is, an organic layer deposition apparatus including a deposition source that discharges a deposition material, a deposition source nozzle unit that is disposed at a side of the deposition source and includes a plurality of deposition source nozzles formed therein, and a patterning slit sheet that faces the deposition source nozzle unit and includes a plurality of patterning slits formed therein is disposed spaced apart by a predetermined distance from a substrate on which the deposition material is to be deposited. In addition, the deposition material discharged from the thin film deposition apparatus 1 (refer to FIG. 1) is deposited on the substrate 2 while the thin film deposition apparatus 1 and the substrate 2 are moved relative to each other.

After the organic layer 63 is formed, the second electrode 62 may be formed by the same deposition method as used to form the organic layer 63.

The first electrode 61 may function as an anode, and the second electrode 62 may function as a cathode. Alternatively, the first electrode 61 may function as a cathode, and the second electrode 62 may function as an anode. The first electrode 61 may be patterned to correspond to individual pixel regions, and the second electrode 62 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer. The first electrode 61 may be formed by forming a layer, such as by sputtering, for example, and then patterning the layer, such as by photolithography, for example.

The second electrode 62 may also be formed as a transparent electrode or a reflective electrode. In one embodiment, the second electrode 62 is formed as a transparent electrode and is used as a cathode. Such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 63 and forming an auxiliary electrode layer or a bus electrode line thereon from ITO, IZO, ZnO, $In_2O_3$, or the like. In one embodiment, the second electrode 62 is formed as a reflective electrode, and the reflective layer may be formed by depositing Li, Ca, LiF/Ca, LiF/Al, Al, Ag, Mg, or a compound thereof on the entire surface of the organic layer 63. The second electrode 62 may be formed using the same deposition method as used to form the organic layer 63 described above.

In one embodiment, a passivation layer 64 is further formed on the second electrode 62. The passivation layer 64 is formed on the second electrode 62 and adapted to protect the second electrode 62 and serve as a mask when the organic layer on a portion other than the pixel region is removed, which will be explained in detail with reference to FIG. 14.

Lastly, an encapsulation substrate 65 may be formed on the organic light-emitting device 60, and seals the OLED 60 from the outside.

The organic layer deposition apparatuses according to embodiments of the present invention described above may be used to form an organic layer or an inorganic layer of an organic TFT, and to form layers from various materials.

A method of manufacturing an organic light-emitting display apparatus by using the thin film deposition apparatus 1 is described below.

Figure 14:
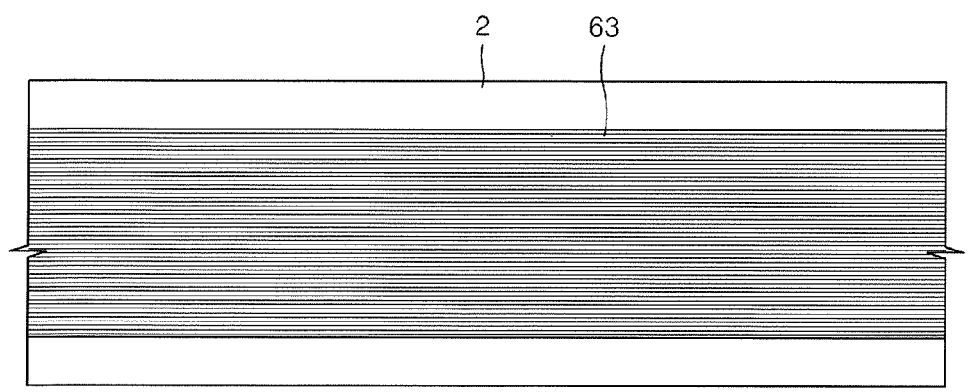
FIGS. 14 through 16 are schematic views for explaining a method of manufacturing an organic light-emitting display apparatus, according to an embodiment of the present invention.
Figure 15:
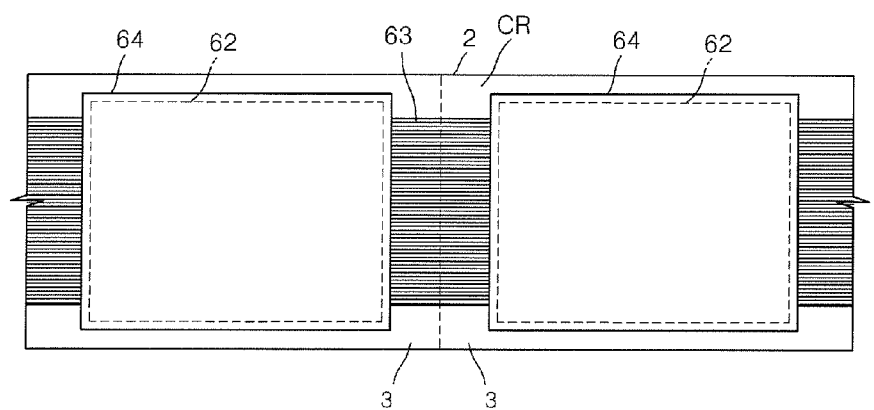
Figure 16:
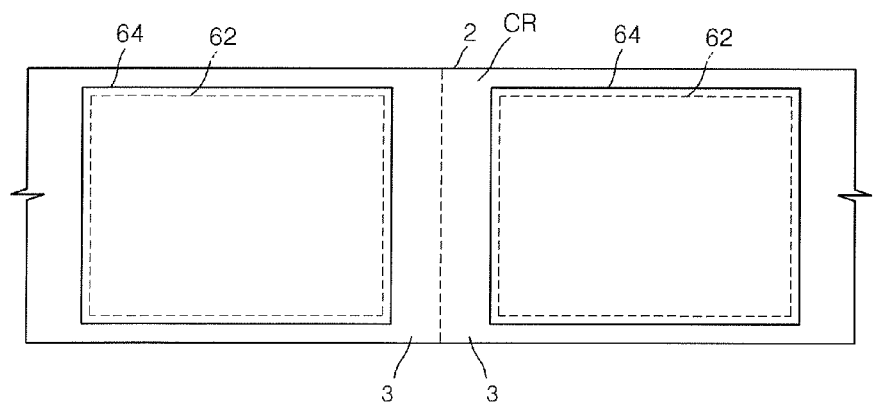

FIGS. 14 through 16 are schematic views for explaining a method of manufacturing an organic light-emitting display apparatus, according to an embodiment of the present invention.

In one embodiment, the TFT 40 (see FIG. 13), the capacitor 50 (see FIG. 13), the first electrode 61 (see FIG. 13), and the pixel-defining layer 35 (see FIG. 13) are sequentially formed on the substrate 2.

Next, as shown in FIG. 14, the organic layer 63 is formed on the first electrode 61 (see FIG. 13) and the pixel-defining layer 35 (see FIG. 13) of the substrate 2 by using the thin film deposition apparatus 1.

As described above, the thin film deposition apparatus 1 includes a patterning slit sheet having a size much less than a size of a conventional FMM. In order to deposit an organic layer on the substrate 2 by using the patterning slit sheet, deposition is performed by moving at least one of the thin film deposition apparatus 1 or the substrate 2 relative to the other. In one embodiment, deposition is performed by moving the substrate 2 in one direction in a scanning manner, and the organic layer 63 is continuously formed as a line on the substrate 2 when the deposition is completed as shown in FIG. 14. That is, the organic layer 63 of a linear pattern is continuously deposited on the substrate 2 on which a plurality of panels (see FIGS. 15 and 16) are disposed in parallel.

However, when organic light-emitting display apparatuses get larger, a plurality of panels, that is, organic light-emitting display apparatuses, may be formed on one mother glass. Each of the panels includes a pixel region from which light is emitted and a circuit region that is disposed outside the pixel region. The circuit region may be used as a terminal when a product is tested or manufactured later. When an organic layer is formed on the circuit region, the circuit region may not act as an electrode. Accordingly, the circuit region has to be a non-film-forming region on which the organic material is not formed. However, as described above, since deposition is performed by moving the substrate 2 with respect to the thin film deposition apparatus in a scanning manner, it is not easy to prevent the organic material from being deposited on the circuit region of the substrate 2.

Furthermore, since the large encapsulation substrate 65 (see FIG. 13) is used, a contact area between the second electrode 62 and the encapsulation substrate 65 is increased, and thus the second electrode 62 and the organic layer 63 under the second electrode 62 may be damaged and the risk of defects of pixels may be increased. Such problems may become severe from an outer portion of the panel toward a middle portion of the panel, and when the substrate 2 slips during scribing or transfer, the problems become more severe.

To address these problems, although attempts have been made to cover the non-film-forming region by using a separate apparatus such as a shutter or a blinder, since the separate apparatus is added, space utilization efficiency in an apparatus has been reduced and manufacturing costs have increased. Although attempts have been made to remove an organic layer formed on the non-film-forming region by using a pre-formed second electrode as a mask, the second electrode is damaged when the organic layer formed on the non-film-forming region is removed and thus may not perform as an electrode.

According to an embodiment of the present invention, in the method of manufacturing the organic light-emitting display apparatus of FIGS. 14 through 16, the passivation layer 64 is formed on the second electrode 62 (see FIG. 13) and prevents or substantially prevents the encapsulation substrate 65 and the second electrode 62 from directly contacting each other. Furthermore, the passivation layer 64 may not only protect the second electrode 62 when an organic material is removed but also be used as a mask for removing an organic layer formed on a non-film-forming region.

In one embodiment, as shown in FIG. 15, the second electrode 62 and the passivation layer 64 are sequentially formed on the organic layer 63. The passivation layer 64 may be formed of an organo-metallic compound including a metal ligand such as tris(8-hydroxyquinolinato)aluminum ($Alq_3$), and a thickness of the passivation layer 64 may be equal to or greater than 1000 Å.

Alternatively, the passivation layer 64 may be formed of a phenylcarbazole-based compound such as HT01. That is, a compound having at least two phenylcarbazole-based derivatives as side chains in a molecule represented by Chemical Formula 1 may be used.

[Chemical Formula 1]

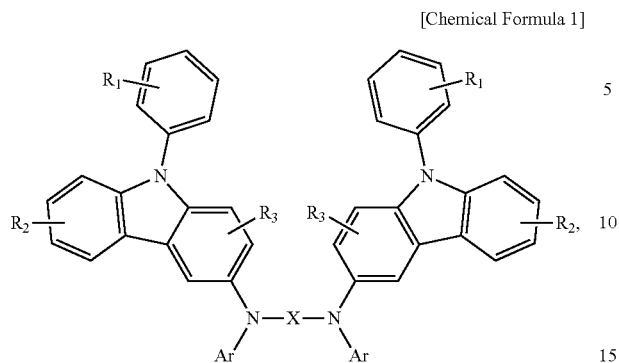

where X is a substituted or unsubstituted C1-C30 alkylene group, substituted or unsubstituted C2-C30 alkenyl group, substituted or unsubstituted C6-C30 arylene group, substituted or unsubstituted C2-C30 heteroarylene group, or substituted or unsubstituted C2-C30 hetero ring; R1, R2, and R3 are independently mono-substituted or multi-substituted groups and each are a hydrogen atom, substituted or unsubstituted alkyl group having 1-30 carbon atoms, substituted or unsubstituted alkoxy group having 1-30 carbon atoms, substituted or unsubstituted aryl group having 6-30 carbon atoms, substituted or unsubstituted aryloxy group having 6-30 carbon atoms, substituted or unsubstituted hetero ring having 2-30 carbon atoms, or substituted or unsubstituted multiple condensed rings having 6-30 carbon atoms, a hydroxy group, a cyano group, or substituted or unsubstituted amino group, wherein adjacent groups from among R1, R2, and R3 may be combined to form a saturated or unsaturated carbon chain; and Ar may be a substituted or unsubstituted C6-C30 aryl group or substituted or unsubstituted C2-C30 heteroaryl group.

Alternatively, the passivation layer 64 may be formed of a fluorene-based compound such as HT211. That is, a compound including at least one fluorine derivative and at least one carbazole derivative represented by Chemical Formula 2 may be used.

[Chemical Formula 2]

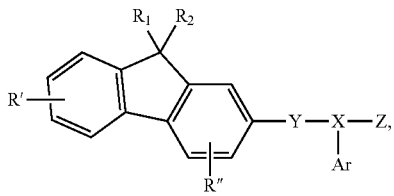

where one is selected from among

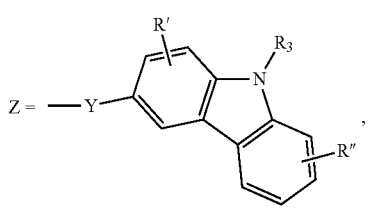

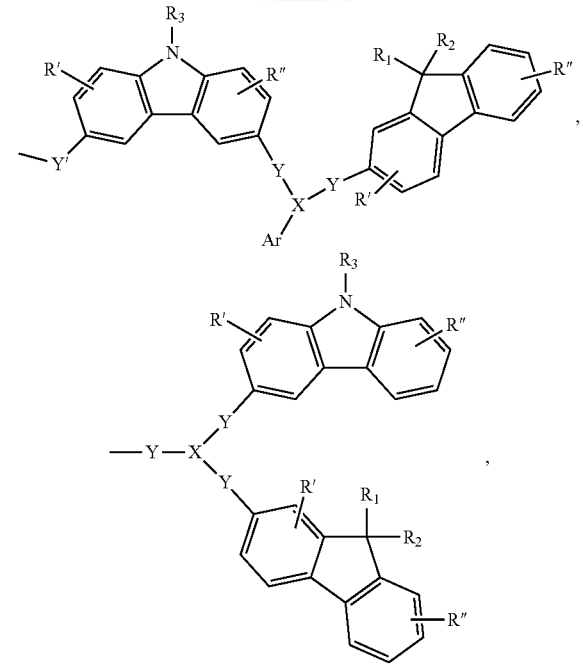

Ar is an independently substituted or unsubstituted aryl group or a group represented by

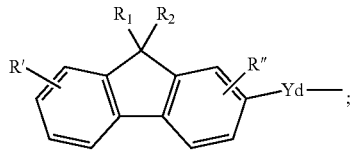

X denotes nitrogen (N), boron (B), or phosphorus (P); Y denotes an independent single bond, or is s substituted or unsubstituted C1-C30 alkylene group, substituted or unsubstituted C6-C30 arylene group, or substituted or unsubstituted C4-C30 hetero ring; R1, R2, and R3 are each an independent hydrogen, substituted or unsubstituted C1-C30 alkyl group, substituted or unsubstituted C6-C30 aryl group, substituted or unsubstituted C4-C30 hetero ring, or substituted or unsubstituted C6-C30 multiple condensed rings, wherein adjacent groups of R1, R2, and R3 are coupled to form a saturated or unsaturated carbon chain; and R' and R" are each selected from the group consisting of an independent hydrogen, a hydroxy group, substituted or unsubstituted C1-C30 alkyl group, and substituted or unsubstituted C6-C30 aryl group.

Due to the passivation layer 64, the encapsulation substrate 65 and the second electrode 62 are prevented or substantially prevented from directly contacting each other, thereby improving product reliability.

The second electrode 62 and the passivation layer 64 may be formed (see FIG. 15) to correspond to the pixel region of each of a plurality of panels 3 disposed in parallel on the substrate 2, and may not be formed on a circuit region CR, that is, the non-film-forming region. In this case, the passivation layer 64 may be formed to be slightly larger than the second electrode 62 in order to cover the entire second electrode 62. Accordingly, the pixel region, that is, the film forming region, is covered by the second electrode 62 and the passivation layer 64 whereas the circuit region CR, that is, the non-film-forming region, may be exposed to the outside.

In this state, when plasma etching is performed, as shown in FIG. 16, the organic layer 63 formed on the circuit region CR of each panel 3 is entirely removed. In order to remove the organic layer 63 in the circuit region CR, chemical etching using plasma including oxygen ($O_2$) may be used. Such plasma etching is well known, and thus a detailed explanation thereof will not be given. Before removing the organic layer 63, a plasma shielding plate may be disposed on the passivation layer.

Alternatively, although not shown, the second electrode 62 and the passivation layer 64 may be deposited when the thin film deposition apparatus 1 and the substrate 2 are moved relative to one another. In one embodiment, deposition is performed by moving the substrate 2 in one direction in a scanning manner, and the second electrode 62 and the passivation layer 64 may be continuously formed as a line on the substrate 2 on which deposition has been completed. In this case, the organic layer 63, the second electrode 62, and the passivation layer 64 formed on the circuit region CR of each panel 3 have to be removed.

According to an embodiment of the present invention, an additional mask for removing an organic layer in a non-film-forming region is not required, a second electrode may be prevented or substantially prevented from being oxidized and a lower organic layer may be prevented or substantially prevented from being damaged when the non-film-forming region is removed by using the second electrode as a mask, and oxygen used during etching for removing an organic material may be prevented or substantially prevented from penetrating into an organic light-emitting display apparatus.

According to aspects of the present invention, a method of manufacturing an organic light-emitting display apparatus is suitable for use in the mass production of a large substrate and enables high-definition patterning, and an organic light-emitting display apparatus may be manufactured by using the method.

While the present invention has been particularly shown and described with reference to some exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display apparatus, the method comprising:
    continuously depositing an organic layer of a linear pattern on a substrate, the substrate including a plurality of panels arranged in a direction, and the linear pattern being continuous between adjacent panels of the plurality of panels;
    depositing a second electrode on the organic layer;
    forming a passivation layer on the second electrode to cover the second electrode; and
    after the forming of the passivation layer, removing the organic layer from a peripheral region of a first panel of the adjacent panels and from a peripheral region of a second panel of the adjacent panels that is adjacent the peripheral region of the first panel along the direction.

2. The method of claim 1,
    wherein the depositing of the second electrode on the organic layer comprises depositing the second electrode on the organic layer for each of the plurality of panels, and
    wherein the forming of the passivation layer on the second electrode comprises forming the passivation layer on the second electrode to cover the second electrode.

3. The method of claim 1,
    wherein the depositing of the second electrode on the organic layer comprises continuously depositing the second electrode of a linear pattern on the organic layer, and
    wherein the forming of the passivation layer on the second electrode comprises continuously forming the passivation layer of a linear pattern on the second electrode to cover the second electrode.

4. The method of claim 1, wherein the passivation layer comprises one or more materials selected from the group consisting of tris(8-hydroxyquinolinato)aluminum ($Alq_3$), a phenylcarbazole-based compound, and a fluorene-based compound.

5. The method of claim 1, wherein the continuous depositing of the organic layer of the linear pattern on the substrate comprises:
    providing a thin film deposition apparatus comprising a deposition source continuing a deposition material, a deposition source nozzle unit that is arranged at a side of the deposition source and includes a plurality of deposition source nozzles, and a patterning slit sheet that is arranged to face the deposition source nozzle unit and has a plurality of patterning slits formed therein, such that the thin film deposition apparatus is spaced apart from the substrate;
    moving at least one of the thin film deposition apparatus or the substrate relative to the other during the depositing; and
    spraying the deposition material from the deposition source to be deposited by passing through the patterning slit sheet and forming a pattern on the substrate.

6. The method of claim 5, wherein the patterning slit sheet is smaller than the substrate in at least one of a first direction or a second direction perpendicular to the first direction.

7. The method of claim 5,
    wherein the deposition source nozzles are arranged in the deposition nozzle unit in a first direction,
    wherein the patterning slits are arranged in the patterning slit sheet in the first direction, and
    wherein the thin film deposition apparatus further comprises a shielding plate assembly that is arranged in the first direction between the deposition source nozzle unit and the patterning slit sheet and comprises a plurality of shielding plates that divide a space between the deposition source nozzle unit and the patterning slit sheet into a plurality of deposition spaces.

8. The method of claim 7, wherein each of the plurality of shielding plates extends in a second direction that is substantially perpendicular to the first direction.

9. The method of claim 7, wherein the shielding plate assembly comprises a first shielding plate assembly that comprises a plurality of first shielding plates, and a second shielding plate assembly that comprises a plurality of second shielding plates.

10. The method of claim 9, wherein each of the plurality of first shielding plates and each of the plurality of second shielding plates is formed in a second direction that is substantially perpendicular to the first direction, and divides a space between the deposition source nozzle unit and the patterning slit sheet into a plurality of deposition spaces.

11. The method of claim 5,
    wherein the deposition source nozzles are arranged in the deposition source nozzle unit in a first direction, and wherein the patterning slits are arranged in the patterning slit sheet in a second direction perpendicular to the first direction.

12. The method of claim 11, wherein the deposition source, the deposition source nozzle unit, and the patterning slit sheet are integrally formed with each other by being coupled to each other by a connection member.

13. The method of claim 12, wherein the connection member guides a flow path of the deposition material.

14. The method of claim 12, wherein the connection member is formed to seal from the outside a space between the deposition source, the deposition source nozzle unit, and the patterning slit sheet.

15. The method of claim 1, wherein the continuous depositing of the organic, layer of the linear pattern on the substrate comprises:
providing a thin film deposition apparatus comprising:
a conveyer unit comprising a transfer unit that fixes the substrate and moves along with the substrate, a first conveyer unit that moves the transfer unit to which the substrate is fixed in a first direction, and a second conveyer unit that moves the transfer unit from which the substrate is separated in a direction opposite to the first direction when the depositing has been completed;
a loading unit that fixes the substrate to the transfer unit;
a deposition unit comprising a chamber that is in vacuum, and at least one organic layer deposition assembly that deposits the organic layer on the substrate fixed to the transfer unit transferred from the loading unit; and
an unloading unit that separates from the transfer unit the substrate on which the deposition has been completed while passing through the deposition unit, such that the thin film deposition apparatus and the substrate are spaced apart from each other;
moving at least one of the thin film deposition apparatus or the substrate relative to the other during the depositing; and
spraying the deposition material from the deposition source to be deposited by passing through a patterning slit sheet of the deposition unit and forming a pattern on the substrate.

16. The method of claim 15,
wherein the transfer unit circulates between the first conveyer unit and the second conveyer unit, and
wherein the substrate fixed to the transfer unit is spaced apart by a distance from the organic layer deposition assembly while being moved by the first conveyer unit.

17. The method of claim 16, wherein the first conveyer unit and the second conveyer unit pass through the deposition unit.

18. The method of claim 16, wherein the first conveyer unit and the second conveyer unit are arranged vertically in parallel.

19. The method of claim 16, wherein the first conveyer unit sequentially moves the transfer unit to the loading unit, the deposition unit, and the unloading unit.

20. The method of claim 16, wherein the second conveyer unit sequentially moves the transfer unit to the unloading unit, the deposition unit, and the loading unit.

21. The method of claim 1, wherein the removing of the organic layer between the adjacent panels comprises removing the organic layer by chemical etching using plasma containing oxygen ($O_2$).

22. The method of claim 4, wherein an inorganic layer is further formed on the passivation layer.

23. The method of claim 21, further comprising, before the removing of the organic layer, disposing a plasma shielding plate on the passivation layer.

* * * * *